(12) United States Patent
Shibayama et al.

(10) Patent No.: US 11,966,164 B2
(45) Date of Patent: *Apr. 23, 2024

(54) SEMICONDUCTOR DEVICE PRODUCTION METHOD EMPLOYING SILICON-CONTAINING RESIST UNDERLAYER FILM-FORMING COMPOSITION INCLUDING ORGANIC GROUP HAVING AMMONIUM GROUP

(71) Applicant: NISSAN CHEMICAL CORPORATION, Tokyo (JP)

(72) Inventors: Wataru Shibayama, Toyama (JP); Hayato Hattori, Toyama (JP); Ken Ishibashi, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 16/759,142

(22) PCT Filed: Oct. 24, 2018

(86) PCT No.: PCT/JP2018/039514
§ 371 (c)(1),
(2) Date: Apr. 24, 2020

(87) PCT Pub. No.: WO2019/082934
PCT Pub. Date: May 2, 2019

(65) Prior Publication Data
US 2021/0181635 A1 Jun. 17, 2021

(30) Foreign Application Priority Data

Oct. 25, 2017 (JP) .................... 2017-206486

(51) Int. Cl.
*G03F 7/075* (2006.01)
*G03F 7/004* (2006.01)
*G03F 7/11* (2006.01)
*G03F 7/42* (2006.01)

(52) U.S. Cl.
CPC ............ *G03F 7/423* (2013.01); *G03F 7/0045* (2013.01); *G03F 7/0752* (2013.01); *G03F 7/0755* (2013.01); *G03F 7/0757* (2013.01); *G03F 7/11* (2013.01); *G03F 7/422* (2013.01); *G03F 7/425* (2013.01)

(58) Field of Classification Search
CPC .... G03F 7/0755; G03F 7/0757; G03F 7/0045; G03F 7/423; G03F 7/426; G03F 7/0752; G03F 7/11; G03F 7/425; G03F 7/36
See application file for complete search history.

(56) References Cited

U.S. PATENT DOCUMENTS

| 9,760,006 B2* | 9/2017 | Nakajima ............. G03F 7/0757 |
| 2010/0291487 A1* | 11/2010 | Nakajima ............. G03F 7/0757 525/474 |
| 2011/0143149 A1 | 6/2011 | Shibayama et al. |
| 2011/0287369 A1 | 11/2011 | Shibayama et al. |
| 2012/0128891 A1 | 5/2012 | Takei et al. |
| 2013/0078814 A1 | 3/2013 | Shibayama et al. |
| 2015/0079792 A1* | 3/2015 | Shigaki ................ C09D 183/08 524/838 |
| 2015/0210829 A1* | 7/2015 | Shibayama .......... C09D 183/04 524/157 |
| 2016/0077440 A1* | 3/2016 | Yamanaka ................ G03F 7/11 430/258 |
| 2016/0284535 A1* | 9/2016 | Lauerhaas ................ G03F 7/425 |
| 2017/0371242 A1* | 12/2017 | Wakayama .............. C09D 4/00 |
| 2018/0149977 A1* | 5/2018 | Shibayama ......... H01L 21/3086 |

FOREIGN PATENT DOCUMENTS

| CN | 106024620 A | 10/2016 |
| JP | 2017-120359 A | 7/2017 |
| WO | 2010/021290 A1 | 2/2010 |

(Continued)

OTHER PUBLICATIONS

Dec. 25, 2018 International Search Report issued in International Patent Application No. PCT/JP2018/039514.
Dec. 25, 2018 Written Opinion of the International Searching Authority issued in International Patent Application No. PCT/JP2018/039514.
Oct. 3, 2022 Office Action issued in U.S. Appl. No. 17/862,932.
Dec. 14, 2022 Office Action issued in Chinese Patent Application No. 201880067123.3.
Feb. 8, 2023 Office Action issued in U.S. Appl. No. 17/862,932.
Jan. 2, 2023 Office Action issued in Korean Patent Application No. 10-2020-7011839.
Oct. 28, 2022 Office Action issued in Taiwanese Patent Application No. 107137662.
Jul. 14, 2023 Office Action issued in U.S. Appl. No. 17/862,932.

(Continued)

*Primary Examiner* — John S Chu
(74) *Attorney, Agent, or Firm* — Oliff PLC

(57) ABSTRACT

A method produces a semiconductor device, the method having a step of transferring an underlayer by employing a resist underlayer film-forming composition containing a hydrolysis condensate prepared through hydrolysis and condensation of a hydrolyzable silane in a non-alcoholic solvent in the presence of a strong acid, followed by a step (G) of removing the patterned resist film, the patterned resist underlayer film, and/or particles with a sulfuric acid-hydrogen peroxide mixture (SPM) prepared by mixing of aqueous hydrogen peroxide with sulfuric acid and/or an ammonia-hydrogen peroxide mixture (SC1) prepared by mixing of aqueous hydrogen peroxide with aqueous ammonia, wherein: the hydrolyzable silane contains a hydrolyzable silane of the following Formula (1):

$$R^1_a R^2_b Si(R^3)_{4-(a+b)} \quad \text{Formula (1)}$$

(wherein R1 is an organic group having a primary amino group, a secondary amino group, or a tertiary amino group and is bonded to a silicon atom via an Si—C bond).

9 Claims, No Drawings

(56) References Cited

FOREIGN PATENT DOCUMENTS

WO         2010/071155 A1    6/2010
WO         2016/080217 A1    5/2016

OTHER PUBLICATIONS

May 8, 2023 Office Action issued in Taiwanese Patent Application No. 107137662.
Apr. 21, 2023 Office Action issued in Chinese Patent Application No. 201880067123.3.
Apr. 20, 2022 Office Action issued in Japanese Patent Application No. 2019-551206.
Aug. 15, 2023 Office Action issued in Chinese Patent Application No. 201880067123.3.
Jan. 17, 2024 Office Action issued in U.S. Appl. No. 17/862,932.

\* cited by examiner

SEMICONDUCTOR DEVICE PRODUCTION METHOD EMPLOYING SILICON-CONTAINING RESIST UNDERLAYER FILM-FORMING COMPOSITION INCLUDING ORGANIC GROUP HAVING AMMONIUM GROUP

TECHNICAL FIELD

The present invention relates to a method for producing a semiconductor device by using a composition for forming an underlayer film between a substrate and a resist (e.g., a photoresist or an electron beam resist) for use in the production of the semiconductor device. More particularly, the present invention relates to a method for producing a semiconductor device by using a resist underlayer film-forming composition for lithography for forming an underlayer film used as a layer under a photoresist in a lithography process for the production of the semiconductor device. Also, the present invention relates to a method for producing a semiconductor device, the method including a method for forming a resist pattern using the underlayer film-forming composition.

BACKGROUND ART

Fine processing by lithography using photoresists has been conventionally performed in the production of semiconductor devices. The fine processing is a processing method involving formation of a photoresist thin film on a semiconductor substrate (e.g., a silicon wafer); irradiation of the thin film with active rays (e.g., ultraviolet rays) through a mask pattern having a semiconductor device pattern drawn thereon; development of the irradiated thin film; and etching of the substrate with the resultant photoresist pattern serving as a protective film, to thereby form, on the surface of the substrate, fine irregularities corresponding to the pattern.

In recent years, resist films have been significantly thinned in state-of-the-art semiconductor devices. In particular, a tri-layer process requires lithographic properties of a silicon-containing resist underlayer film, as well as high etching rate. In particular, lithography using EUV as a light source requires, for improving lithographic properties, introduction of a large amount of a functional group exhibiting high adhesion to a resist, and addition of a large amount of a photoacid generator for improving resolution. However, an increase in the amount of such an organic component causes a serious problem in terms of a reduction in etching rate.

There has been disclosed a resist underlayer film-forming composition containing a silane compound having an onium group. Examples of the onium group include ammonium group, sulfonium group, iodonium group, and phosphonium group. Such a silane compound is hydrolyzed in an alcoholic solvent (e.g., ethanol) in the presence of an organic acid serving as a catalyst, to thereby produce a polysiloxane (see Patent Document 1).

There has also been disclosed a resist underlayer film containing a silane compound having an anionic group. Examples of the anionic group include carboxylate group and sulfonate group.

PRIOR ART DOCUMENTS

Patent Documents

Patent Document 1: International Publication WO 2010-021290 Pamphlet
Patent Document 2: International Publication WO 2010-071155 Pamphlet

SUMMARY OF THE INVENTION

Problems to be Solved by the Invention

The present invention provides a method for producing a semiconductor device by using a resist underlayer film-forming composition, wherein the composition can achieve a high etching rate during etching with halogen gas by a hydrolysis condensate (polysiloxane) containing a curing catalyst in a step of transferring a resist pattern onto an underlayer film in accordance with a reduction in the thickness of a resist film in a tri-layer process, and the composition can form a resist underlayer film capable of being removed with a chemical after processing of a substrate.

Means for Solving the Problems

A first aspect of the present invention is a method for producing a semiconductor device, the method comprising a step (A) of applying, onto a semiconductor substrate, a resist underlayer film-forming composition containing a hydrolysis condensate prepared through hydrolysis and condensation of a hydrolyzable silane in a non-alcoholic solvent in the presence of a strong acid, followed by baking the composition, to thereby form a resist underlayer film; a step (B) of applying a resist composition onto the resist underlayer film to thereby form a resist film; a step (C) of exposing the resist film to light; a step (D) of developing the resist film after the light exposure to thereby form a patterned resist film; a step (E) of etching the resist underlayer film with the patterned resist film; a step (F) of processing the semiconductor substrate with the patterned resist film and resist underlayer film; and a step (G) of removing the patterned resist film, the patterned resist underlayer film, and/or particles with a sulfuric acid-hydrogen peroxide mixture (SPM) prepared by mixing of aqueous hydrogen peroxide with sulfuric acid and/or an ammonia-hydrogen peroxide mixture (SC1) prepared by mixing of aqueous hydrogen peroxide with aqueous ammonia, wherein:

the hydrolyzable silane contains a hydrolyzable silane of the following Formula (1):

$$R^1{}_a R^2{}_b Si(R^3)_{4-(a+b)} \qquad \text{Formula (1)}$$

(wherein $R^1$ is an organic group having a primary amino group, a secondary amino group, or a tertiary amino group and is bonded to a silicon atom via an Si—C bond; $R^2$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; $R^1$ and $R^2$ are optionally bonded together to form a ring structure; $R^3$ is an alkoxy group, an acyloxy group, or a halogen group; a is an integer of 1; b is an integer of 0 to 2; and a+b is an integer of 1 to 3); and the hydrolysis condensate contains an organic group having a salt structure formed between a counter anion derived from a strong acid and a counter cation derived from a primary ammonium group, a secondary ammonium group, or a tertiary ammonium group.

A second aspect of the present invention is a method for producing a semiconductor device, the method comprising a step (a) of forming an organic underlayer film on a semiconductor substrate; a step (b) of applying, onto the organic underlayer film, a resist underlayer film-forming composition containing a hydrolysis condensate prepared through hydrolysis and condensation of a hydrolyzable silane in a non-alcoholic solvent in the presence of a strong acid, followed by baking the composition, to thereby form a resist underlayer film; a step (c) of applying a resist composition onto the resist underlayer film to thereby form a resist film; a step (d) of exposing the resist film to light; a step (e) of developing the resist film after the light exposure to thereby form a patterned resist film; a step (f) of etching the resist underlayer film with the patterned resist film; a step (g) of etching the organic underlayer film with the patterned resist underlayer film; a step (h) of processing the semiconductor substrate with the patterned organic underlayer film; and a step (i) of removing the patterned resist film, the patterned resist underlayer film, the patterned organic underlayer film, and/or particles with a sulfuric acid-hydrogen peroxide mixture (SPM) prepared by mixing of aqueous hydrogen peroxide with sulfuric acid and/or an ammonia-hydrogen peroxide mixture (SC1) prepared by mixing of aqueous hydrogen peroxide with aqueous ammonia, wherein:

the hydrolyzable silane contains a hydrolyzable silane of the following Formula (1):

$$R^1_a R^2_b Si(R^3)_{4-(a+b)} \qquad \text{Formula (1)}$$

(wherein $R^1$ is an organic group having a primary amino group, a secondary amino group, or a tertiary amino group and is bonded to a silicon atom via an Si—C bond; $R^2$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amide group, a hydroxyl group, an alkoxy group, an ester group, a sulfonyl group, or a cyano group, or any combination of these groups, and is bonded to a silicon atom via an Si—C bond; $R^1$ and $R^2$ are optionally bonded together to form a ring structure; $R^3$ is an alkoxy group, an acyloxy group, or a halogen group; a is an integer of 1; b is an integer of 0 to 2; and a+b is an integer of 1 to 3); and
the hydrolysis condensate contains an organic group having a salt structure formed between a counter anion derived from a strong acid and a counter cation derived from a primary ammonium group, a secondary ammonium group, or a tertiary ammonium group.

A third aspect of the present invention is a method for producing a semiconductor device according to the first or second aspect, wherein the resist underlayer film-forming composition further comprises a hydrolyzable silane of Formula (1), a hydrolysis product thereof, or a combination of these.

A fourth aspect of the present invention is a method for producing a semiconductor device according to the first or second aspect, wherein the non-alcoholic solvent is a ketone or an ether.

A fifth aspect of the present invention is a method for producing a semiconductor device according to any one of the first to third aspects, wherein the strong acid is an inorganic acid or carboxylic acid having a pKa of 5 or less.

A sixth aspect of the present invention is a method for producing a semiconductor device according to any one of the first to fifth aspects, wherein the hydrolyzable silane contains, besides a hydrolyzable silane of Formula (1), at least one hydrolyzable silane selected from the group consisting of a hydrolyzable silane of the following Formula (2):

$$R^4_c Si(R^5)_{4-c} \qquad \text{Formula (2)}$$

(wherein $R^4$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; $R^5$ is an alkoxy group, an acyloxy group, or a halogen group; and c is an integer of 0 to 3) and a hydrolyzable silane of the following Formula (3):

$$[R^6_d Si(R^7)_{3-d}]_2 Y_e \qquad \text{Formula (3)}$$

(wherein $R^6$ is an alkyl group and is bonded to a silicon atom via an Si—C bond; $R^7$ is an alkoxy group, an acyloxy group, or a halogen group; Y is an alkylene group or an arylene group; d is an integer of 0 or 1; and e is an integer of 0 or 1).

A seventh aspect of the present invention is a method for producing a semiconductor device according to the sixth aspect, wherein the amount of a hydrolyzable silane of Formula (1) contained in the entire hydrolyzable silane is 0.1% by mole to 100% by mole relative to the total amount by mole of the entire hydrolyzable silane.

An eighth aspect of the present invention is a method for producing a semiconductor device according to any one of the first to seventh aspects, wherein the resist underlayer film-forming composition further comprises a crosslinkable compound.

A ninth aspect of the present invention is a method for producing a semiconductor device according to any one of the first to eighth aspects, wherein the resist underlayer film-forming composition further comprises an acid or an acid generator.

A tenth aspect of the present invention is a method for producing a semiconductor device according to any one of the first to ninth aspects, wherein the resist underlayer film-forming composition further comprises water.

An eleventh aspect of the present invention is a method for producing a semiconductor device according to any one of the first to tenth aspects, wherein the resist underlayer film is an EUV resist underlayer film, and the resist underlayer film has a thickness of 1 nm to 30 nm.

Effects of the Invention

Formation of a fine pattern tends to cause a reduction in the thickness of a resist film for preventing pattern collapse. In a dry etching process for transferring a pattern to an underlayer film present below the thinned resist film, the pattern cannot be transferred to the underlayer film if the etching rate of the underlayer film is not higher than that of the film above the underlayer film. In the present invention, a substrate is coated sequentially with a resist underlayer film (containing an inorganic silicon compound) and a resist film (organic resist film) with or without intervention of an organic underlayer film disposed on the substrate. The dry etching rate of an organic component film greatly differs from that of an inorganic component film depending on a selected etching gas. Specifically, the dry etching rate of an organic component film increases by using an oxygen-containing gas, whereas the dry etching rate of an inorganic component film increases by using a halogen-containing gas.

Lithography using EUV as a light source requires, for improving lithographic properties, introduction of a large amount of a functional group exhibiting high adhesion to a resist into a resist underlayer film, and addition of a large amount of a photoacid generator for improving resolution. However, an increase in the amount of such an organic component causes a serious problem in terms of a reduction in the etching rate of the resist underlayer film.

The present invention solves the aforementioned problem by using a hydrolysis condensate (polysiloxane) having a polymer skeleton that is provided with a catalytic function during preparation of the hydrolysis condensate (polysiloxane) through condensation of a hydrolysis product, in order to reduce the amount of an organic component that decreases the etching rate. The hydrolysis of a hydrolyzable silane having an alkoxy group (i.e., hydrolysis of an alkoxide for generation of silanol) is performed in a non-alcoholic solvent for preventing the reversible conversion of silanol to the alkoxide, to thereby form a polysiloxane precursor containing a large amount of silanol. When a polysiloxane is formed by utilizing the aforementioned catalytic function, the polysiloxane has a dense structure, and the resultant resist underlayer film exhibits high performance as a hard mask.

When a hydrolyzable silane having an organic group having a primary amino group, a secondary amino group, or a tertiary amino group is hydrolyzed with a strong acid, the primary amino group, the secondary amino group, or the tertiary amino group is converted into a primary ammonium group, a secondary ammonium group, or a tertiary ammonium group, and the hydrolysis condensate (polysiloxane) having a catalytic function can be obtained. Since the primary ammonium group, the secondary ammonium group, or the tertiary ammonium group has a catalytic function, a curing catalyst is not required to be added to the resist underlayer film, and thus the etching rate of the resist underlayer film does not decrease during dry etching.

The resist underlayer film used in the present invention is an EUV resist underlayer film, and the resist underlayer film may have a thickness of 1 nm to 20 nm or 1 nm to 5 nm.

The EUV resist underlayer film to be used must have a very small thickness. The resist underlayer film-forming composition is required to have stability for application of the composition to achieve a small coating thickness of 1 nm to 20 nm or 1 nm to 5 nm. Thus, the hydrolyzable silane is hydrolyzed in a non-alcoholic solvent for irreversible hydrolysis (i.e., complete hydrolysis) of the silane. The subsequent condensation of the resultant hydrolysis product can reduce the amount of a silanol group, which may cause destabilization of the composition.

When the primary amino group, the secondary amino group, or the tertiary amino group is converted into the primary ammonium group, the secondary ammonium group, or the tertiary ammonium group by using a strong acid, silanol groups after complete hydrolysis are reliably cured by the action of the primary ammonium group, the secondary ammonium group, or the tertiary ammonium group, to thereby form a favorable cured film.

After processing of the substrate, the resist underlayer film used in the present invention or particles on the substrate can be removed with a chemical (e.g., SPM solution: a mixture of aqueous hydrogen peroxide and sulfuric acid, or SC1 solution: a mixture of aqueous hydrogen peroxide and aqueous ammonia) without use of ashing; i.e., the resist underlayer film can be removed without causing any damage to the substrate.

Thus, the present invention can provide a method for producing a semiconductor device by using a resist underlayer film-forming composition, wherein the composition can achieve a high etching rate during etching with halogen gas by a hydrolysis condensate (polysiloxane) containing a curing catalyst, and the composition can form a resist underlayer film capable of being removed with a chemical after processing of a substrate.

MODES FOR CARRYING OUT THE INVENTION

The present invention is directed to a method for producing a semiconductor device, the method comprising a step (A) of applying, onto a semiconductor substrate, a resist underlayer film-forming composition containing a hydrolysis condensate prepared through hydrolysis and condensation of a hydrolyzable silane in a non-alcoholic solvent in the presence of a strong acid, followed by baking the composition, to thereby form a resist underlayer film; a step (B) of applying a resist composition onto the resist underlayer film to thereby form a resist film; a step (C) of exposing the resist film to light; a step (D) of developing the resist film after the light exposure to thereby form a patterned resist film; a step (E) of etching the resist underlayer film with the patterned resist film; a step (F) of processing the semiconductor substrate with the patterned resist film and resist underlayer film; and a step (G) of removing the patterned resist film, the patterned resist underlayer film, and/or particles with a sulfuric acid-hydrogen peroxide mixture (SPM) prepared by mixing of aqueous hydrogen peroxide with sulfuric acid and/or an ammonia-hydrogen peroxide mixture (SC1) prepared by mixing of aqueous hydrogen peroxide with aqueous ammonia, wherein:

the hydrolyzable silane contains a hydrolyzable silane of Formula (1); and the hydrolysis condensate contains an organic group having a salt structure formed between a counter anion derived from a strong acid and a counter cation derived from a primary ammonium group, a secondary ammonium group, or a tertiary ammonium group.

In Formula (1), $R^1$ is an organic group having a primary amino group, a secondary amino group, or a tertiary amino group and is bonded to a silicon atom via an Si—C bond. The organic group represented by $R^1$ must have at least one primary amino group, secondary amino group, or tertiary amino group. For example, the organic group may have two, three, four, or five amino groups. In such a case, the organic group must have at least one primary amino group, secondary amino group, or tertiary amino group. Preferably used is a hydrolysis condensate containing a counter cation having a tertiary ammonium group prepared by hydrolysis of a hydrolyzable silane having a tertiary amino group with a strong acid.

The aforementioned organic group may contain, besides a nitrogen atom forming an amino group, a heteroatom such as an oxygen atom or a sulfur atom.

In Formula (1), $R^2$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; $R^3$ is an alkoxy group, an acyloxy group, or a halogen group; a is an integer of 1; b is an integer of 0 to 2; and a+b is an integer of 1 to 3.

The present invention is also directed to a method for producing a semiconductor device, the method comprising a step (a) of forming an organic underlayer film on a semiconductor substrate; a step (b) of applying, onto the organic underlayer film, a resist underlayer film-forming composition containing the aforementioned hydrolysis condensate, followed by baking the composition, to thereby form a resist underlayer film; a step (c) of applying a resist composition onto the resist underlayer film to thereby form a resist film; a step (d) of exposing the resist film to light; a step (e) of developing the resist film after the light exposure to thereby form a patterned resist film; a step (f) of etching the resist underlayer film with the patterned resist film; a step (g) of etching the organic underlayer film with the patterned resist underlayer film; a step (h) of processing the semiconductor substrate with the patterned organic underlayer film; and a step (i) of removing the patterned resist film, the patterned resist underlayer film, the patterned organic underlayer film, and/or particles with a sulfuric acid-hydrogen peroxide mixture (SPM) prepared by mixing of aqueous hydrogen peroxide with sulfuric acid and/or an ammonia-hydrogen peroxide mixture (SC1) prepared by mixing of aqueous hydrogen peroxide with aqueous ammonia.

The aforementioned non-alcoholic solvent is a ketone or an ether. Examples of the ketone solvent include acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone.

Examples of the ether solvent include ethyl ether, i-propyl ether, n-butyl ether, n-hexyl ether, 2-ethyl hexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran.

Of these, a ketone solvent such as acetone is preferably used.

The aforementioned strong acid reacts with a primary amino group, a secondary amino group, or a tertiary amino group, to thereby generate a primary ammonium group, a secondary ammonium group, or a tertiary ammonium group. The strong acid must have such a pka that it neutralizes an amino group. The acid preferably has a pka of 5 or less.

Examples of the strong acid include hydrochloric acid, nitric acid, sulfuric acid, phosphoric acid, acetic acid, chloroacetic acid, dichloroacetic acid, trichloroacetic acid, trifluoroacetic acid, maleic acid, methanesulfonic acid, camphorsulfonic acid, and trifluoromethanesulfonic acid.

The resist underlayer film-forming composition used in the present invention contains the aforementioned hydrolysis condensate and a solvent. The composition may contain optional components, such as an acid, water, an alcohol, a curing catalyst, an acid generator, an additional organic polymer, a light-absorbing compound, and a surfactant.

The resist underlayer film-forming composition used in the present invention has a solid content of, for example, 0.1 to 50% by mass, 0.1 to 30% by mass, or 0.1 to 25% by mass. The term "solid content" as used herein corresponds to the amount of all components of the resist underlayer film-forming composition, except for the amount of a solvent component.

The hydrolyzable silane, a hydrolysis product thereof, and a hydrolysis condensate thereof account for 20% by mass or more (e.g., 50 to 100% by mass, 60 to 99% by mass, or 70 to 99% by mass) of the solid content.

The aforementioned hydrolysis condensate may be in the form of a mixture of the hydrolyzable silane, the hydrolysis product, the hydrolysis condensate, and an incomplete hydrolysis product (i.e., a partial hydrolysis product) obtained during preparation of the hydrolysis condensate. The mixture may be used in the resist underlayer film-forming composition. The condensate is a polymer having a polysiloxane structure.

The aforementioned hydrolyzable silane may be a hydrolyzable silane of Formula (1).

In Formula (1), $R^1$ is an organic group having a primary amino group, a secondary amino group, or a tertiary amino group and is bonded to a silicon atom via an Si—C bond; $R^2$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; $R^3$ is an alkoxy group, an acyloxy group, or a halogen group; a is an integer of 1; b is an integer of 0 to 2; and a+b is an integer of 1 to 3.

The aforementioned alkyl group is a linear or branched alkyl group; for example, a $C_{1-10}$ alkyl group. Examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The alkyl group may be a cyclic alkyl group. Examples of cyclic alkyl groups having a carbon atom number of 1 to 10 include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propylcyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. A bicyclo group may be used.

The alkenyl group is, for example, a $C_{2-10}$ alkenyl group, and examples thereof include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The aryl group is, for example, a $C_{6-40}$ aryl group, and examples thereof include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The acyloxyalkyl group may be a combination of any of the aforementioned alkyl groups and any of the below-described acyloxy groups. Examples of the acyloxyalkyl group include acetoxymethyl group, acetoxyethyl group, and acetoxypropyl group.

Examples of the organic group having an epoxy group include glycidoxymethyl, glycidoxyethyl, glycidoxypropyl, glycidoxybutyl, and epoxycyclohexyl.

Examples of the organic group having an acryloyl group include acryloylmethyl, acryloylethyl, and acryloylpropyl.

Examples of the organic group having a methacryloyl group include methacryloylmethyl, methacryloylethyl, and methacryloylpropyl.

Examples of the organic group having a mercapto group include ethylmercapto, butylmercapto, hexylmercapto, and octylmercapto.

Examples of the organic group having an amino group include amino group, aminomethyl group, and aminoethyl group.

Examples of the organic group having a cyano group include cyanoethyl and cyanopropyl.

Examples of the organic group having an amino group or an amide group include cyanuric acid derivatives.

Examples of the organic group having a hydroxyl group include aryl groups bonded to a hydroxyl group, such as hydroxyphenyl group.

Examples of the organic group having a sulfonyl group include sulfonylalkyl group and sulfonylaryl group.

The alkoxyalkyl group is an alkyl group substituted with an alkoxy group. Examples of the alkoxyalkyl group include methoxymethyl group, ethoxymethyl group, ethoxyethyl group, and ethoxymethyl group.

The aforementioned organic group having an alkoxy group is, for example, a group having a $C_{1-20}$ alkoxy group, such as an alkoxy group having a linear, branched, or cyclic alkyl moiety having a carbon atom number of 1 to 20. Examples of the alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

The aforementioned organic group having an acyloxy group is, for example, a $C_{2-20}$ acyloxy group. Examples of the $C_{2-20}$ acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the aforementioned halogen group include fluorine, chlorine, bromine, and iodine.

Examples of the halogenated alkyl group include groups prepared by substitution of at least one hydrogen atom of any of the aforementioned alkyl groups with any of the aforementioned halogen groups.

Examples of the halogenated aryl group include groups prepared by substitution of at least one hydrogen atom of any of the aforementioned aryl groups with any of the aforementioned halogen groups.

Examples of the hydrolyzable silane of Formula (1) having a primary amino group, a secondary amino group, or a tertiary amino group are as follows.

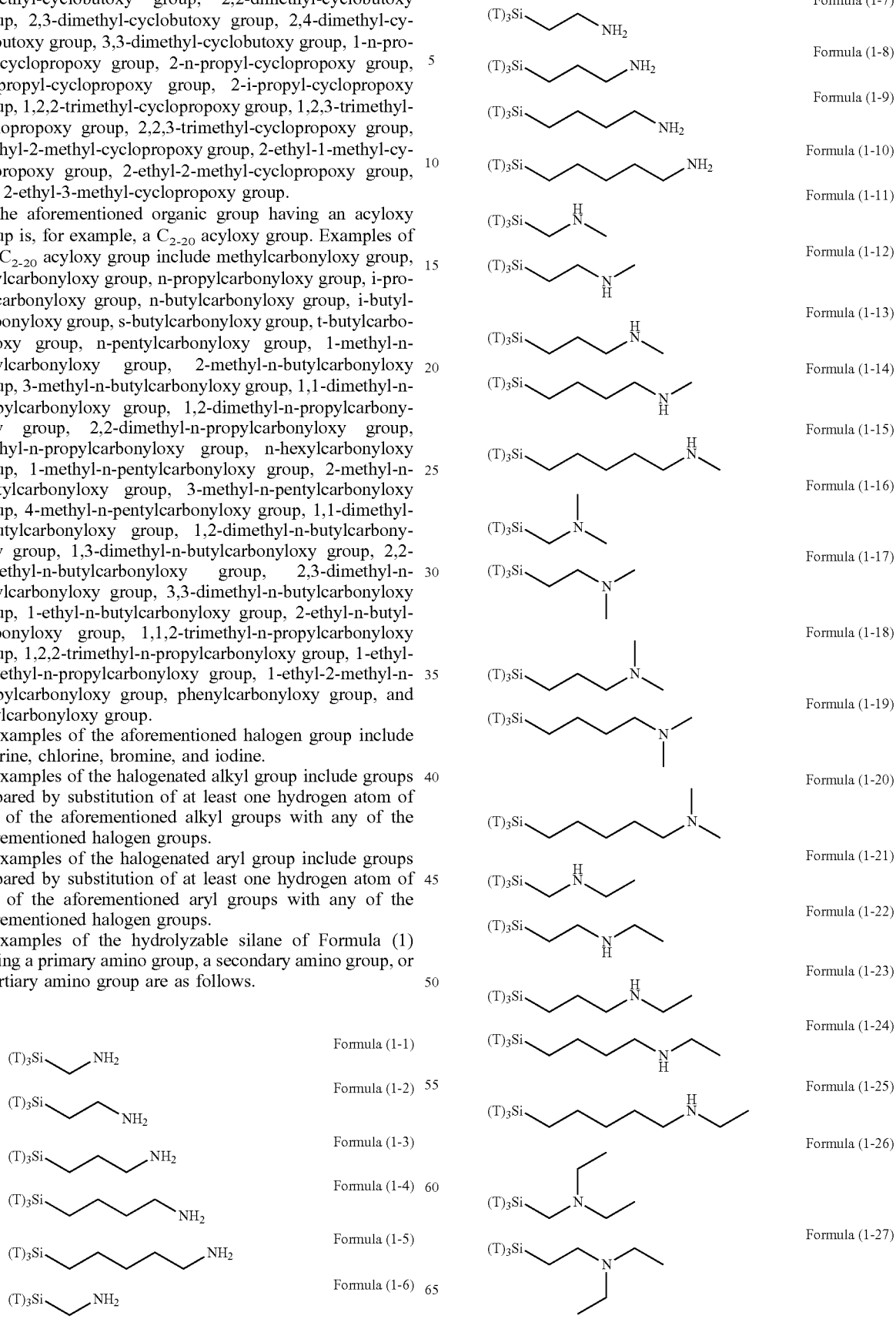

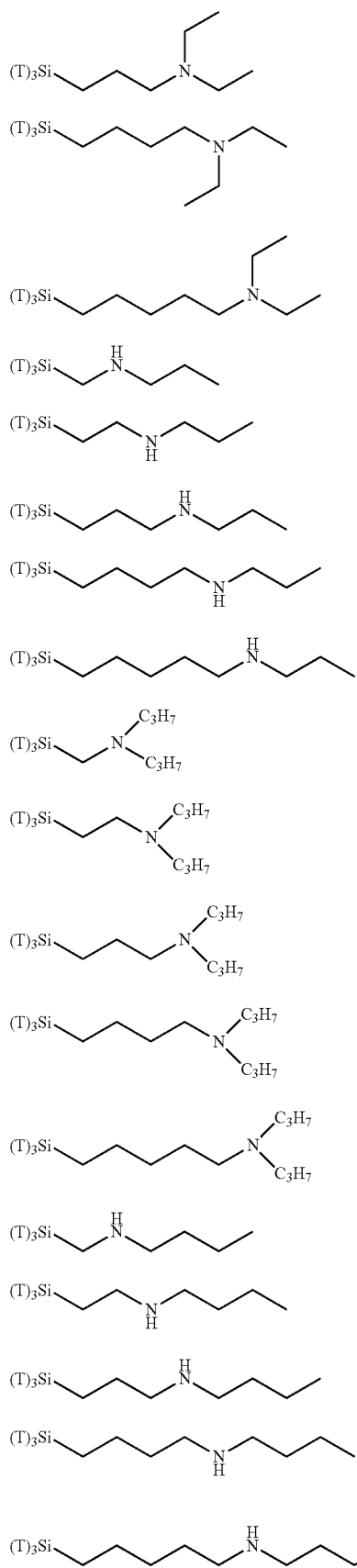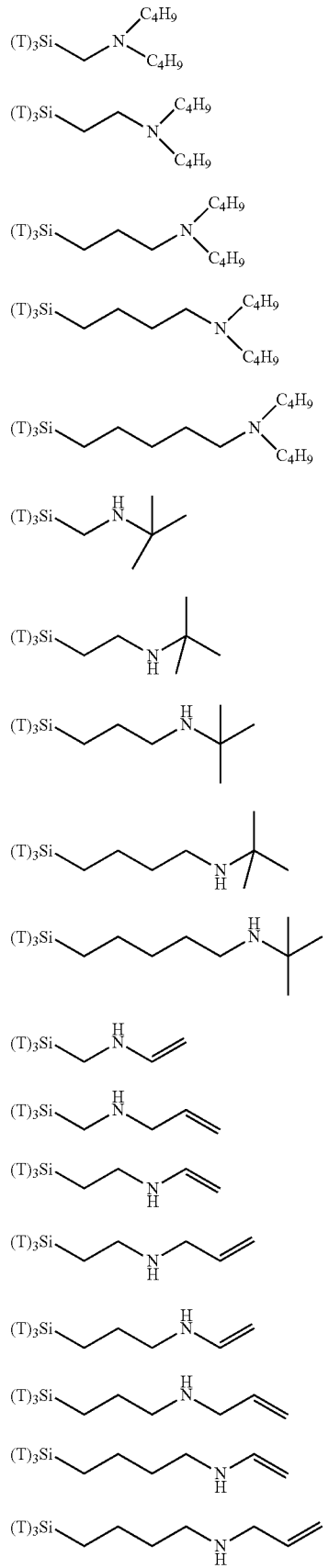

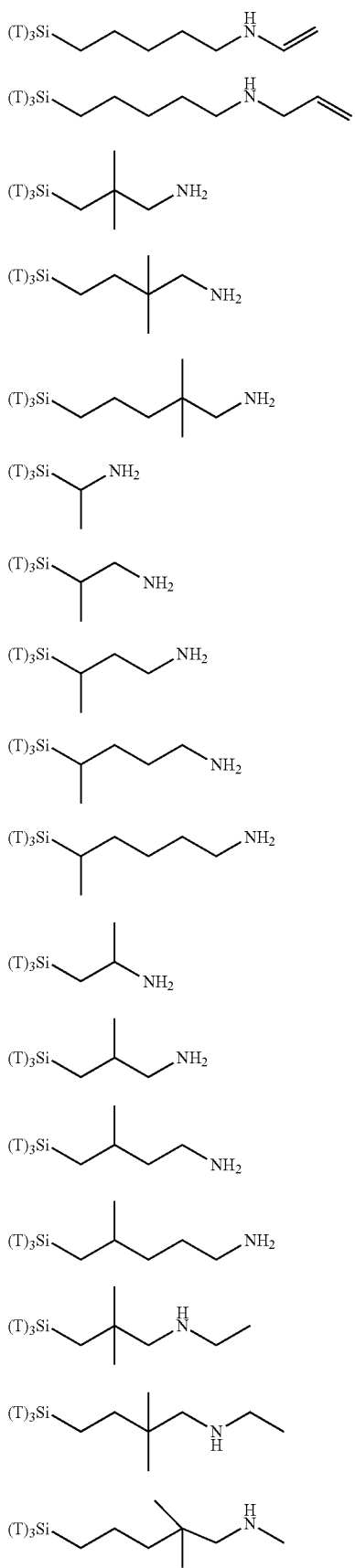

-continued (T)₃Si−(CH₂)₄−N(CH₃)−CH₂CH₂−OH    Formula (1-98)

(T)₃Si−(CH₂)₅−N(CH₃)−CH₂CH₂−OH    Formula (1-99)

(T)₃Si−CH₂−NH−CH₂CH₂−NH₂    Formula (1-100)

(T)₃Si−CH₂CH₂−NH−CH₂CH₂−NH₂    Formula (1-101)

(T)₃Si−(CH₂)₃−NH−CH₂CH₂−NH₂    Formula (1-102)

(T)₃Si−(CH₂)₄−NH−CH₂CH₂−NH₂    Formula (1-103)

(T)₃Si−(CH₂)₅−NH−CH₂CH₂−NH₂    Formula (1-104)

(T)₃Si−CH₂−NH−CH₂CH₂−NH−CH₂CH₃    Formula (1-105)

(T)₃Si−CH₂CH₂−NH−CH₂CH₂−NH−CH₂CH₃    Formula (1-106)

(T)₃Si−(CH₂)₃−NH−CH₂CH₂−NH−CH₂CH₃    Formula (1-107)

(T)₃Si−(CH₂)₄−NH−CH₂CH₂−NH−CH₂CH₃    Formula (1-108)

(T)₃Si−(CH₂)₅−NH−CH₂CH₂−NH−CH₂CH₃    Formula (1-109)

(T)₃Si−CH₂−NH−CH₂CH₂−NH−CH₂CH₂−NH₂    Formula (1-110)

(T)₃Si−CH₂CH₂−NH−CH₂CH₂−NH−CH₂CH₂−NH₂    Formula (1-111)

(T)₃Si−(CH₂)₃−NH−CH₂CH₂−NH−CH₂CH₂−NH₂    Formula (1-112)

(T)₃Si−(CH₂)₄−NH−CH₂CH₂−NH−CH₂CH₂−NH₂    Formula (1-113)

-continued (T)₃Si−(CH₂)₅−NH−CH₂CH₂−NH−CH₂CH₂−NH₂    Formula (1-114)

(T)₃Si−CH₂−NH−(CH₂)₅−NH₂    Formula (1-115)

(T)₃Si−CH₂CH₂−NH−(CH₂)₅−NH₂    Formula (1-116)

(T)₃Si−(CH₂)₃−NH−(CH₂)₅−NH₂    Formula (1-117)

(T)₃Si−(CH₂)₄−NH−(CH₂)₅−NH₂    Formula (1-118)

(T)₃Si−(CH₂)₅−NH−(CH₂)₅−NH₂    Formula (1-119)

(T)₃Si−CH₂−C(=O)−NH−NH₂    Formula (1-120)

(T)₃Si−CH₂CH₂−C(=O)−NH−NH₂    Formula (1-121)

(T)₃Si−(CH₂)₃−C(=O)−NH−NH₂    Formula (1-122)

(T)₃Si−(CH₂)₄−C(=O)−NH−NH₂    Formula (1-123)

(T)₃Si−(CH₂)₅−C(=O)−NH−NH₂    Formula (1-124)

(T)₃Si−CH₂−N(aziridine-COOCH₃)    Formula (1-125)

(T)₃Si−CH₂CH₂−N(aziridine-COOCH₃)    Formula (1-126)

(T)₃Si−(CH₂)₃−N(aziridine-COOCH₃)    Formula (1-127)

(T)₃Si−(CH₂)₄−N(aziridine-COOCH₃)    Formula (1-128)

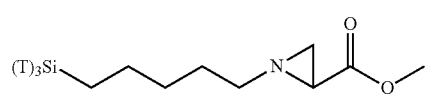
Formula (1-125)
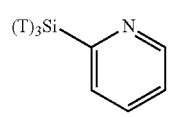
Formula (1-126)
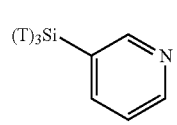
Formula (1-127)
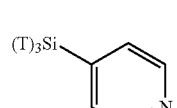
Formula (1-128)
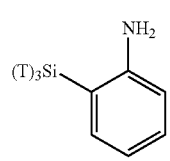
Formula (1-129)
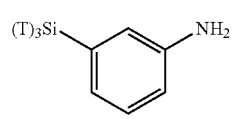
Formula (1-130)
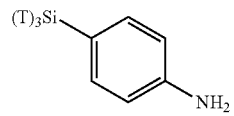
Formula (1-131)
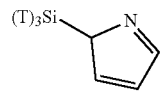
Formula (1-132)
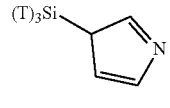
Formula (1-133)
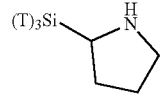
Formula (1-134)
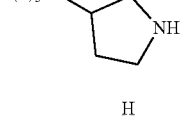
Formula (1-135)
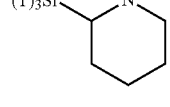
Formula (1-136)
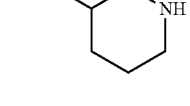
Formula (1-137)
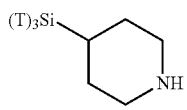
Formula (1-138)
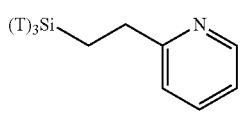
Formula (1-139)
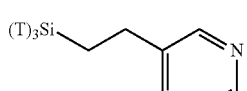
Formula (1-140)
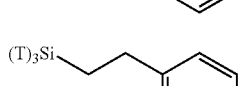
Formula (1-141)
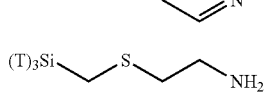
Formula (1-142)
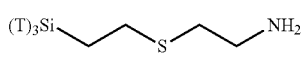
Formula (1-143)
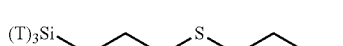
Formula (1-144)
Formula (1-145)
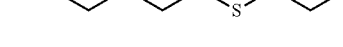
Formula (1-146)
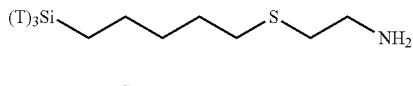
Formula (1-147)
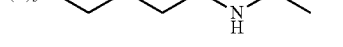
Formula (1-148)
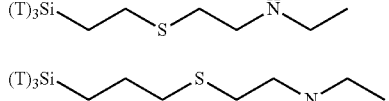
Formula (1-149)
Formula (1-150)
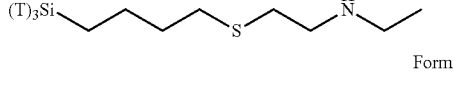
Formula (1-151)
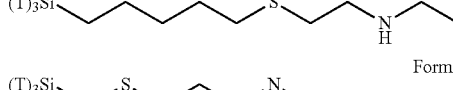
Formula (1-152)
Formula (1-153)
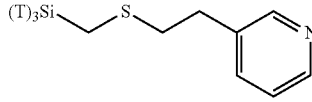
Formula (1-154)

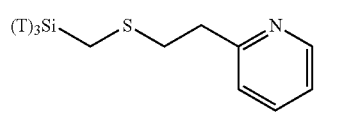
Formula (1-155)
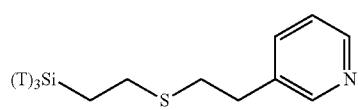
Formula (1-156)
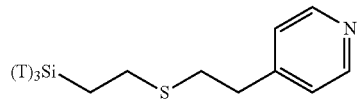
Formula (1-157)
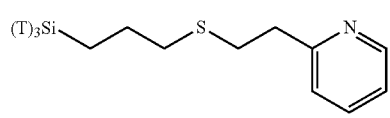
Formula (1-158)
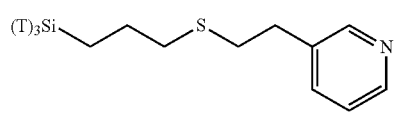
Formula (1-159)
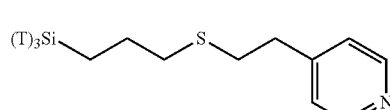
Formula (1-160)
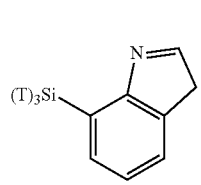
Formula (1-161)
Formula (1-162)
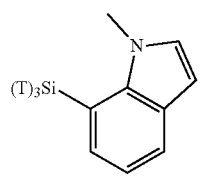
Formula (1-163)
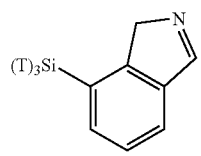
Formula (1-164)
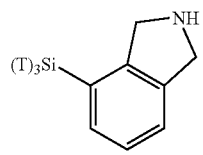
Formula (1-165)
Formula (1-166)
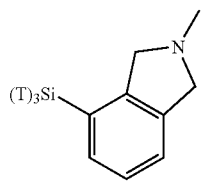
Formula (1-167)
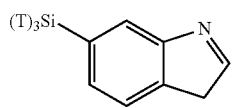
Formula (1-168)
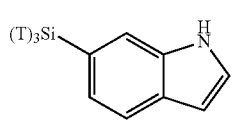
Formula (1-169)
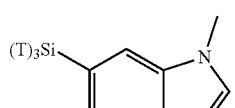
Formula (1-170)
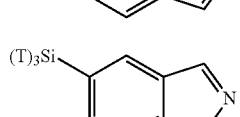
Formula (1-171)
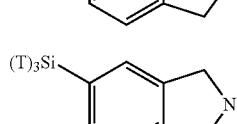
Formula (1-172)
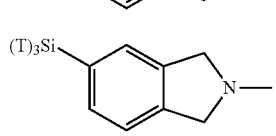
Formula (1-173)
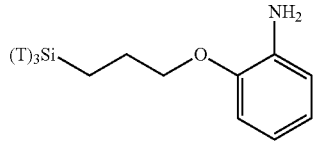
Formula (1-174)
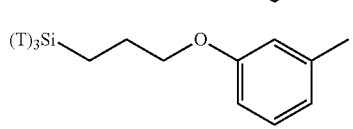
Formula (1-175)
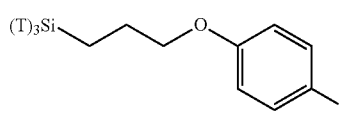
Formula (1-176)
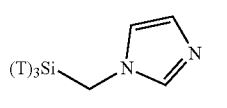
Formula (1-177)
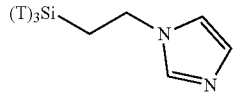
Formula (1-178)
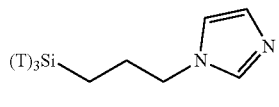

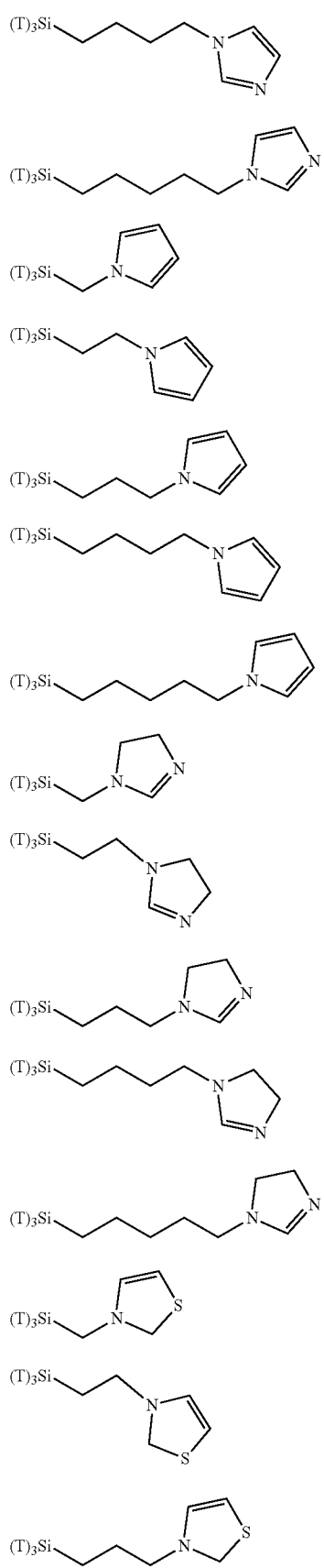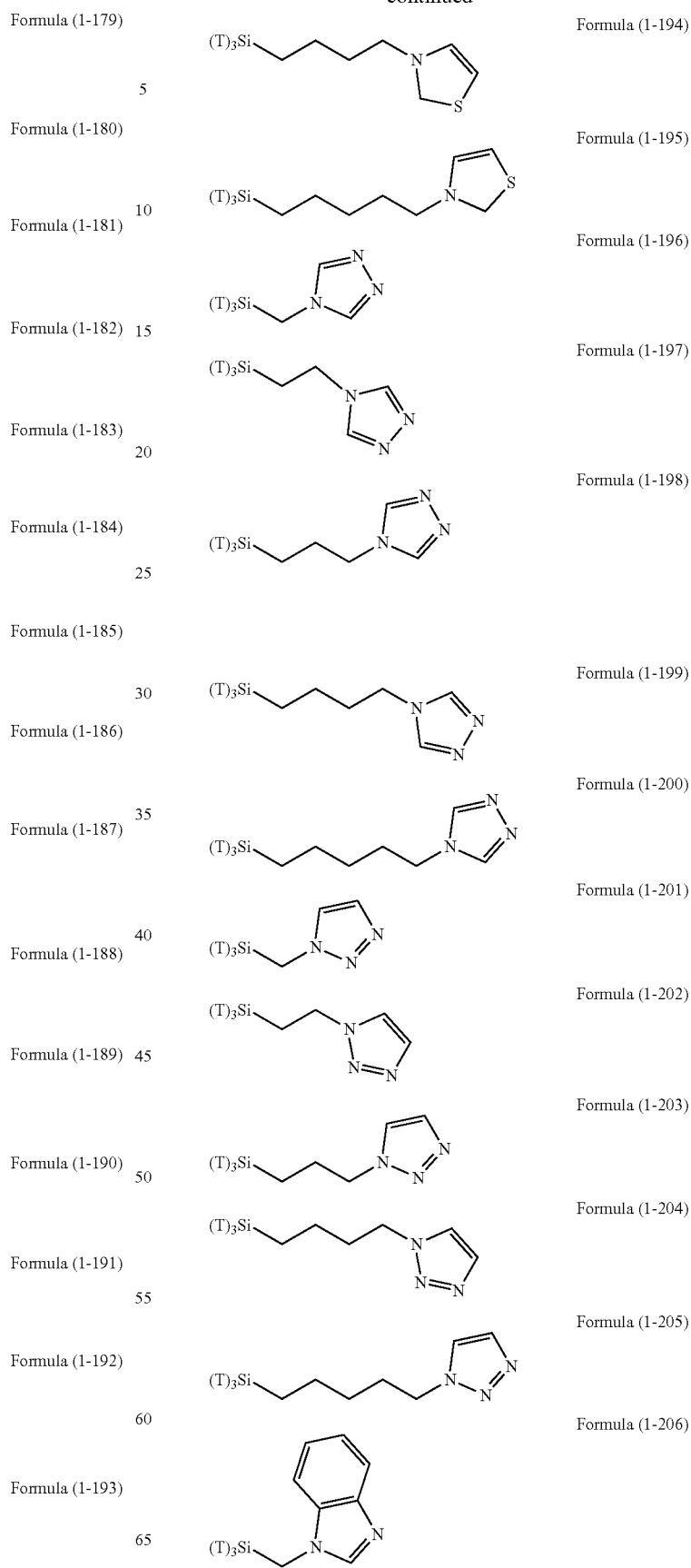

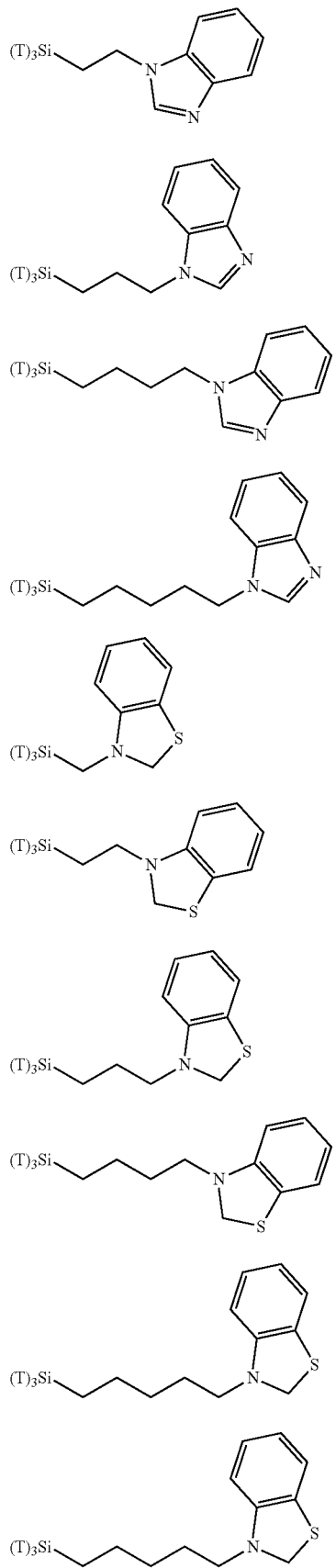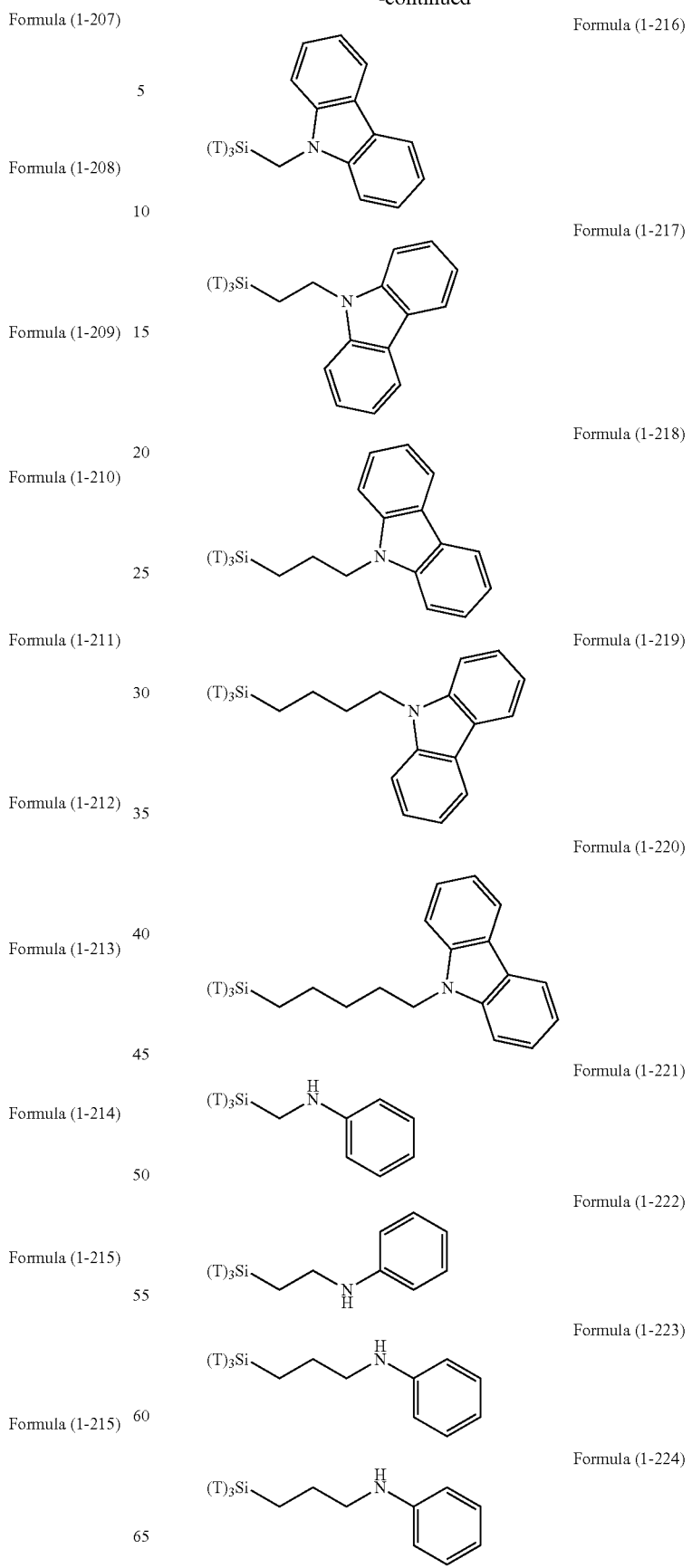

-continued
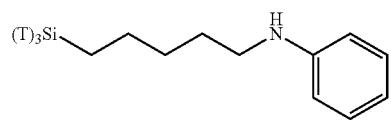
Formula (1-225)
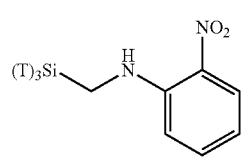
Formula (1-226)
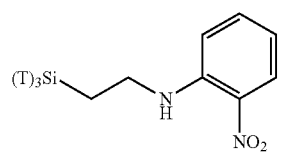
Formula (1-227)
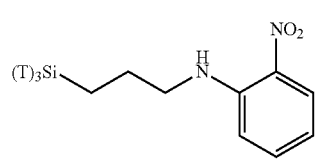
Formula (1-228)
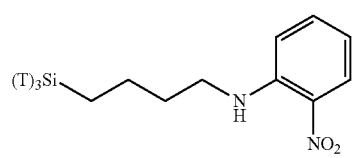
Formula (1-229)
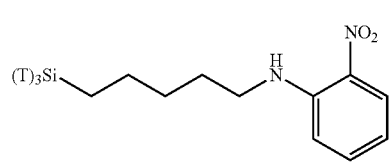
Formula (1-230)
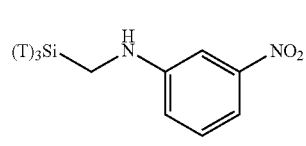
Formula (1-231)
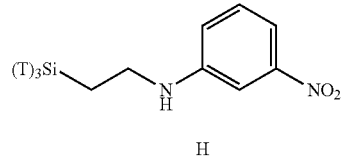
Formula (1-232)
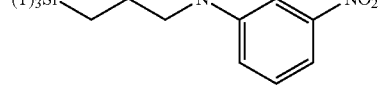
Formula (1-233)
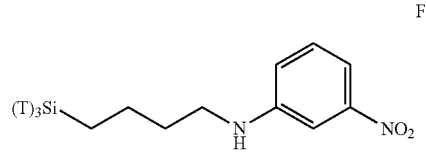
Formula (1-234)
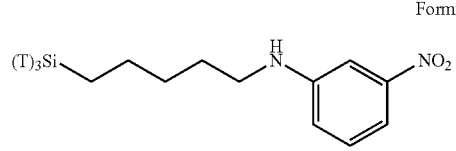
Formula (1-235)
-continued
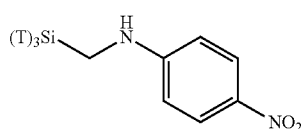
Formula (1-236)
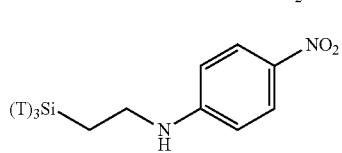
Formula (1-237)
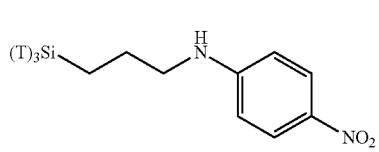
Formula (1-238)
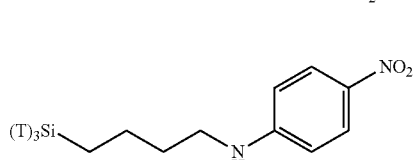
Formula (1-239)
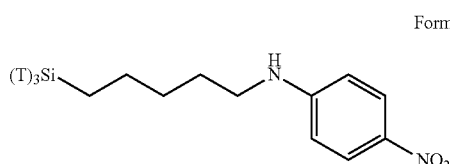
Formula (1-240)
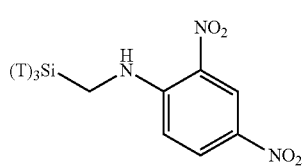
Formula (1-241)
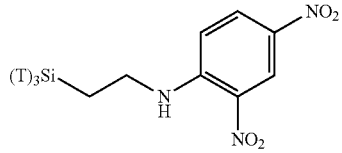
Formula (1-242)
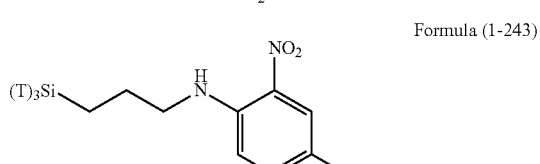
Formula (1-243)
Formula (1-244)
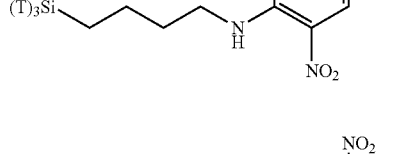
Formula (1-245)
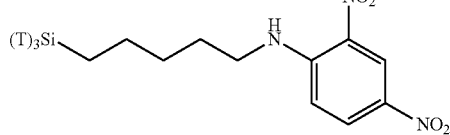

Formula (1-246)
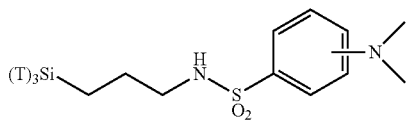
Formula (1-247)
Formula (1-248)
Formula (1-249)
Formula (1-250)
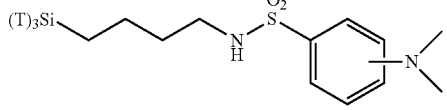
Formula (1-251)
Formula (1-252)
Formula (1-253)
Formula (1-254)
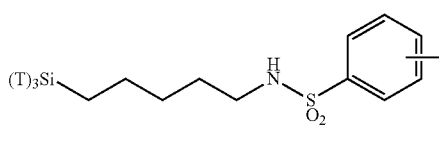
Formula (1-255)
Formula (1-256)
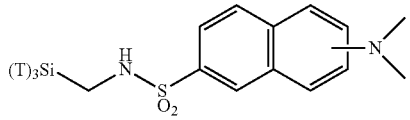
Formula (1-257)
Formula (1-258)
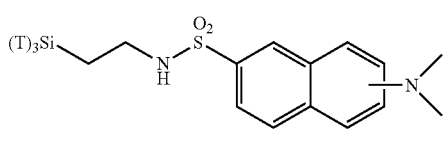
Formula (1-259)
Formula (1-260)
Formula (1-261)
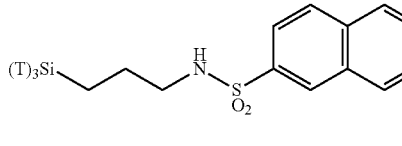
Formula (1-262)
Formula (1-263)
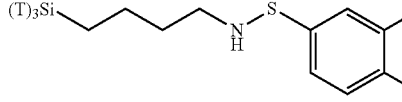
Formula (1-264)
Formula (1-265)
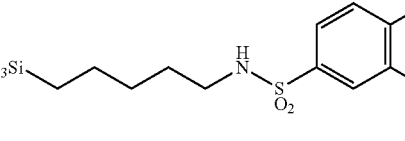
Formula (1-266)
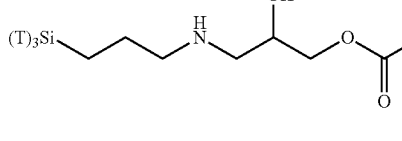
Formula (1-267)
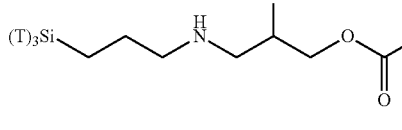

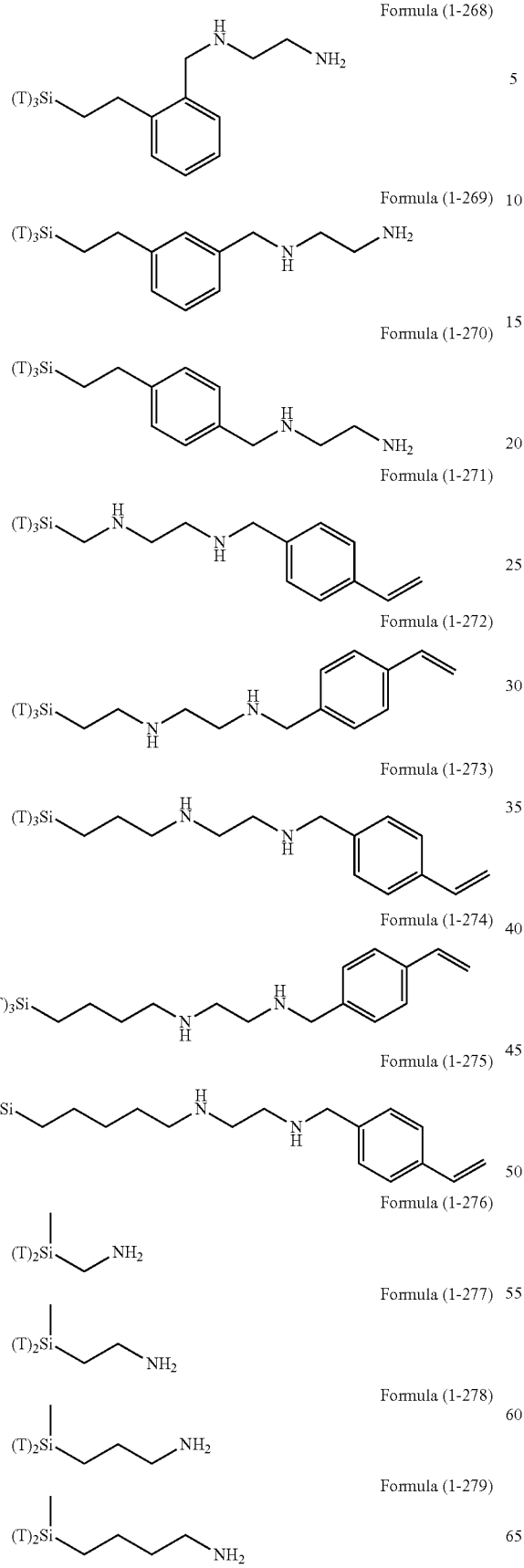
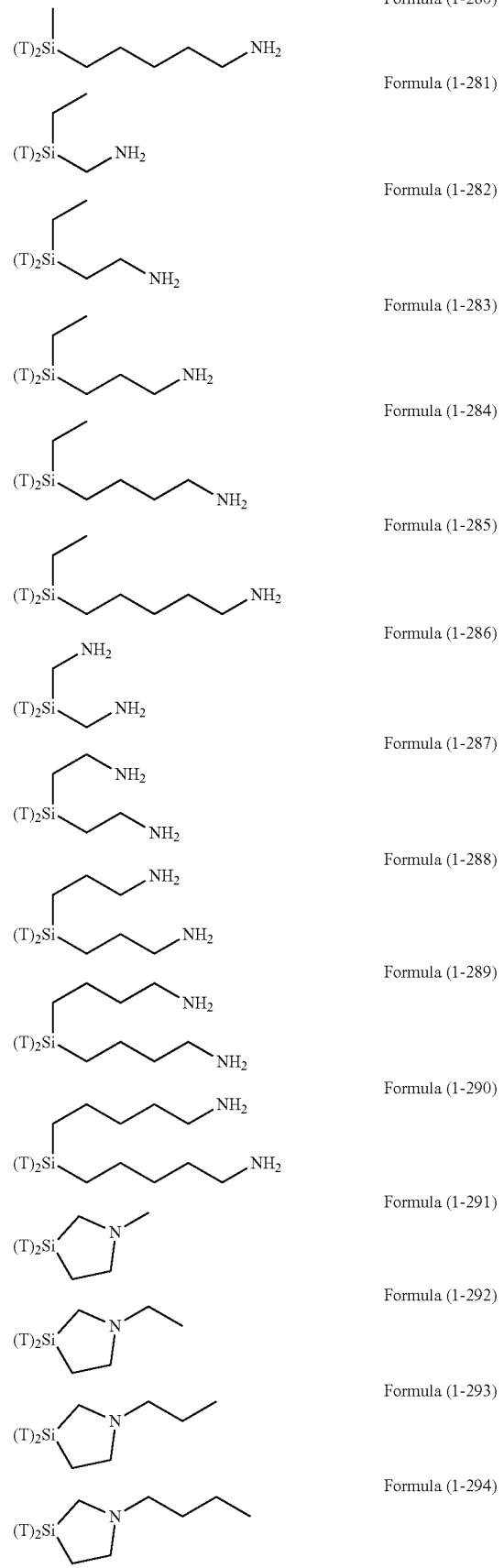

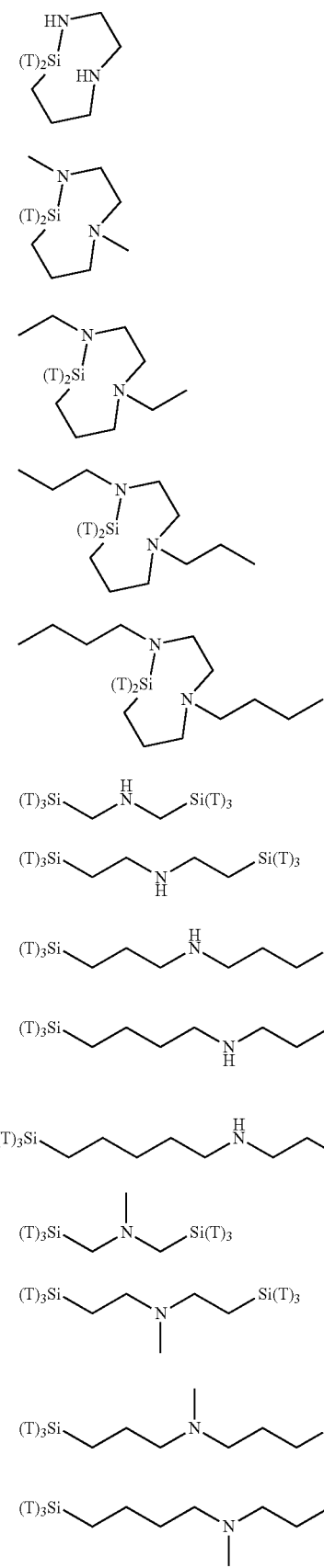
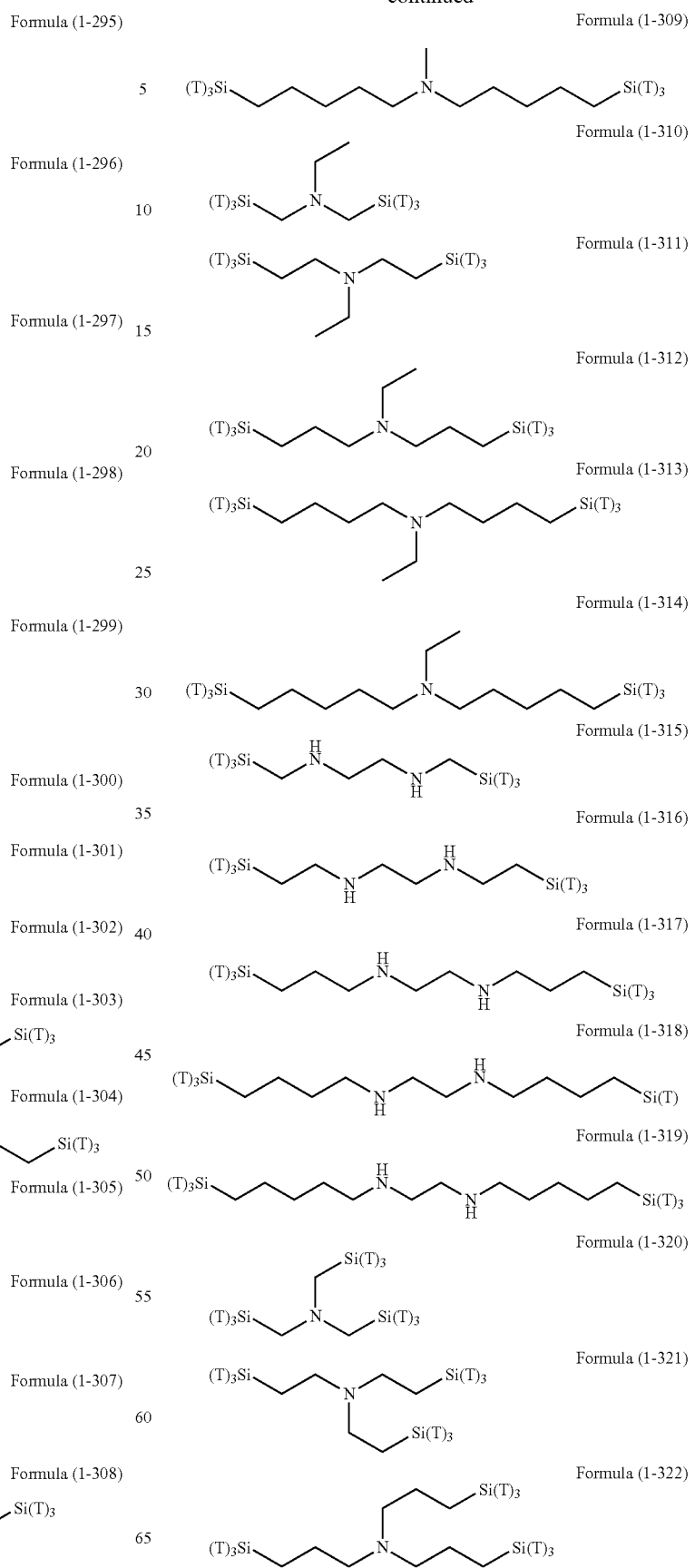

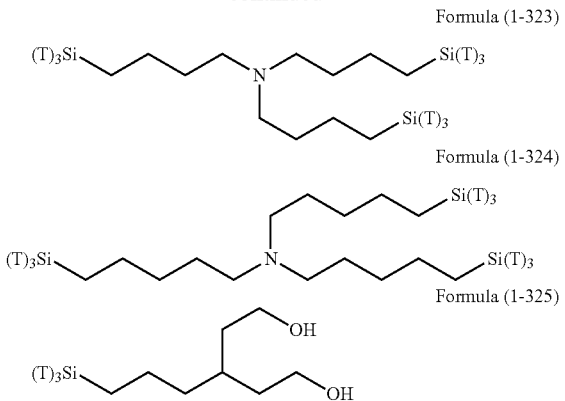

Formula (1-323), Formula (1-324), Formula (1-325)

T in the aforementioned formulae is an alkoxy group, an acyloxy group, or a halogen group, and is preferably, for example, a methoxy group or an ethoxy group.

In the present invention, the aforementioned hydrolyzable silane may contain, besides a hydrolyzable silane of Formula (1), at least one hydrolyzable silane selected from the group consisting of hydrolyzable silanes of Formulae (2) and (3).

The amount of a hydrolyzable silane of Formula (1) contained in the entire hydrolyzable silane is 0.1 to 100% by mole or 0.1 to 70% by mole.

Regarding the hydrolyzable silane of Formula (2), in Formula (2), $R^4$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; $R^5$ is an alkoxy group, an acyloxy group, or a halogen group; and c is an integer of 0 to 3.

Regarding the hydrolyzable silane of Formula (3), in Formula (3), $R^6$ is an alkyl group and is bonded to a silicon atom via an Si—C bond; $R^7$ is an alkoxy group, an acyloxy group, or a halogen group; Y is an alkylene group or an arylene group; d is an integer of 0 or 1; and e is an integer of 0 or 1.

The above-exemplified groups can be applied to the alkyl group, aryl group, halogenated alkyl group, halogenated aryl group, alkoxyaryl group, alkenyl group, acyloxyalkyl group, or organic group having an acryloyl group, a methacryloyl group, a mercapto group, an amino group, an amide group, a hydroxyl group, an alkoxy group, an ester group, a sulfonyl group, or a cyano group, alkoxy group, acyloxy group, and halogen group.

Specific examples of the hydrolyzable silane of Formula (2) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltrichlorosilane, methyltriacetoxysilane, methyltriethoxysilane, methyltripropoxysilane, methyltriacetixysilane, methyltributoxysilane, methyltripropoxysilane, methyltriamyloxysilane, methyltriphenoxysilane, methyltribenzyloxysilane, methyltriphenethyloxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, methylvinyldiethoxysilane, acetoxymethyltrimethoxysilane, acetoxyethyltrimethoxysilane, acetoxypropyltrimethoxysilane, acetoxymethyltriethoxysilane, acetoxyethyltriethoxysilane, acetoxypropyltriethoxysilane, cyclohexyltrimethoxysilane, cyclohexyltriacetoxysilane, cyclohexyltriethoxysilane, cyclohexyltripropoxysilane, cyclohexyltriacetixysilane, cyclohexyltributoxysilane, cyclohexyltripropoxysilane, cyclohexyltriamyloxysilane, cyclohexyltriphenoxysilane, triethoxysilylpropyldiallyl isocyanurate, glycidoxypropyltrimethoxysilane, phenylsulfonylpropyltriethoxysilane, bicyclo(2,2,1)hept-5-en-yltriethoxysilane, cyclohexylepoxyethyltrimethoxysilane, trifluoroacetamidopropyltriethoxysilane, p-ethoxyethoxyphenyltrimethoxysilane, and triethoxysilylpropylsuccinic anhydride.

Specific examples of the hydrolyzable silane of Formula (3) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Other examples of the hydrolyzable silane of Formula (2) are as follows.

Formula (2-1)
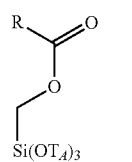
Formula (2-2)
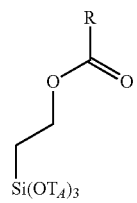
Formula (2-3)
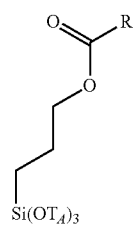
Formula (2-4)
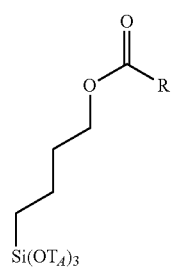
Formula (2-5)
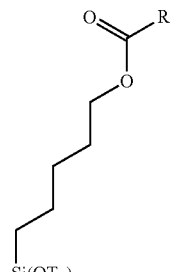
Formula (2-6)
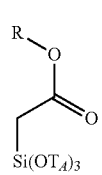
Formula (2-7)
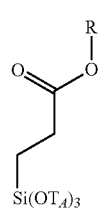
Formula (2-8)
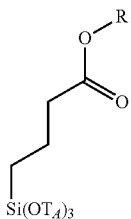
Formula (2-9)
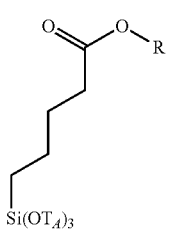
Formula (2-10)
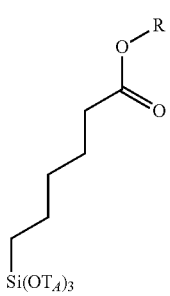
Formula (2-11)
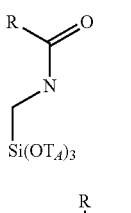
Formula (2-12)
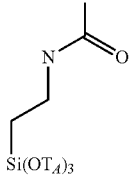
Formula (2-13)
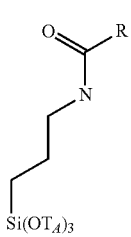
Formula (2-14)
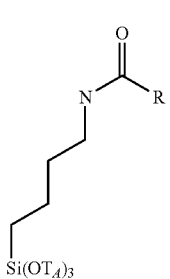

-continued
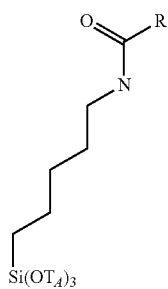
Formula (2-15)
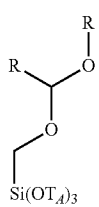
Formula (2-16)
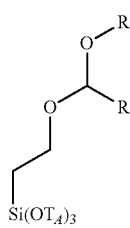
Formula (2-17)
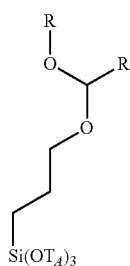
Formula (2-18)
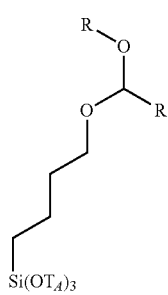
Formula (2-19)
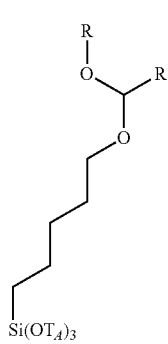
Formula (2-20)
-continued
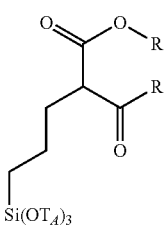
Formula (2-21)
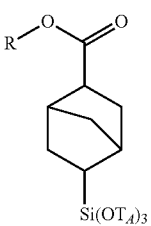
Formula (2-22)
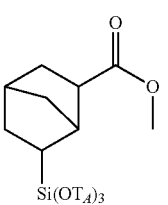
Formula (2-23)
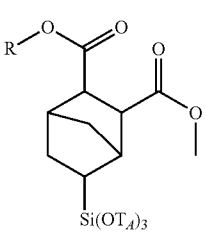
Formula (2-24)
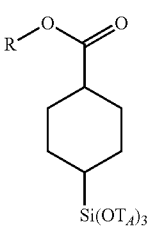
Formula (2-25)
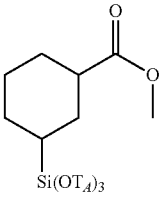
Formula (2-26)
Formula (2-27)

-continued

Formula (2-36)
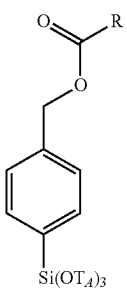

Formula (2-37)
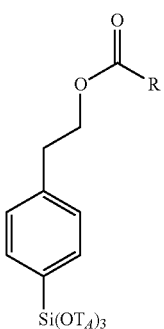

Formula (2-38)
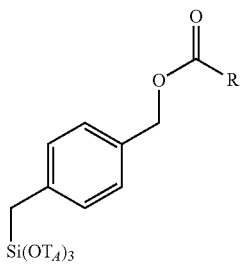

Formula (2-39)
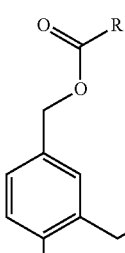
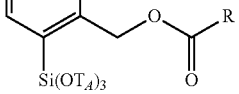

Formula (2-40)
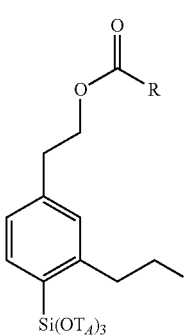

In the aforementioned Formulae, $T_A$ is an alkyl group and may be any of the above-exemplified alkyl groups. For example, the alkyl group is preferably a methyl group or an ethyl group.

In the aforementioned Formulae, R is any of the below-exemplified groups.

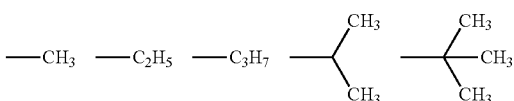

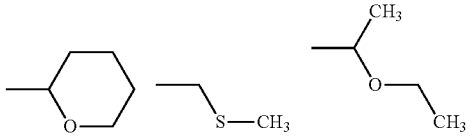

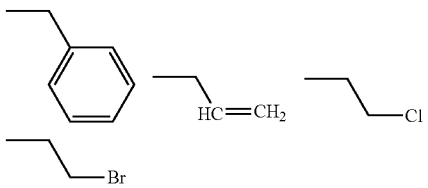

Examples of the hydrolysis condensate used in the present invention are as follows.

Formula (A-1)
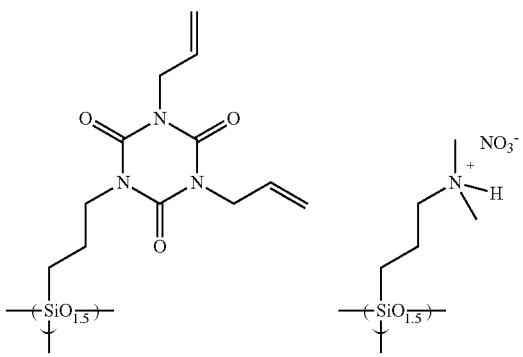

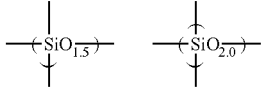

Formula (A-2)
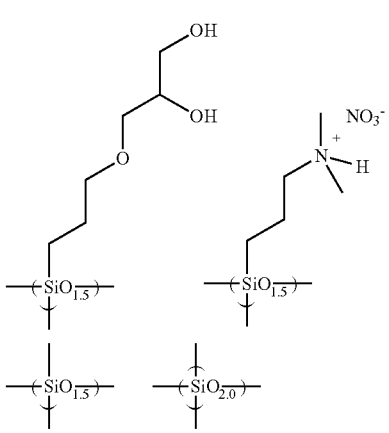

Formula (A-3)
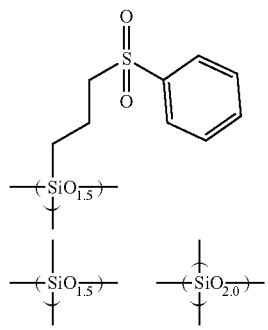 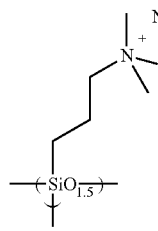
Formula (A-4)
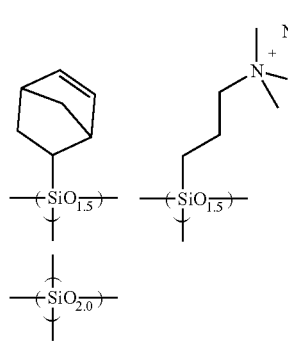
Formula (A-5)
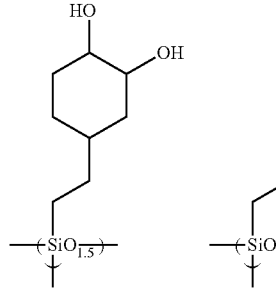
Formula (A-6)
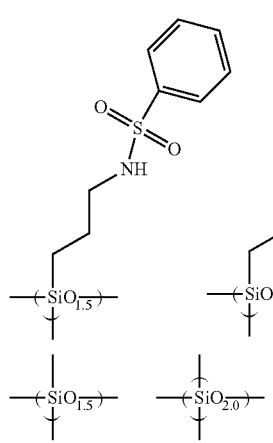
Formula (A-7)
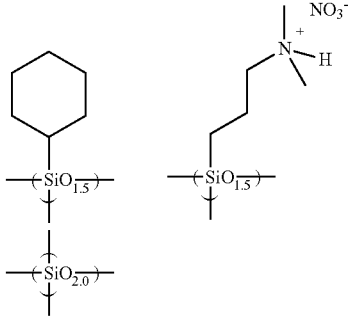
Formula (A-8)
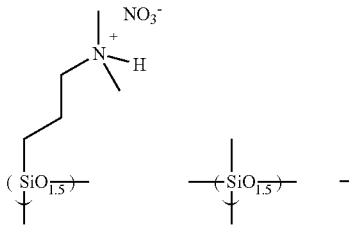
Formula (A-9)
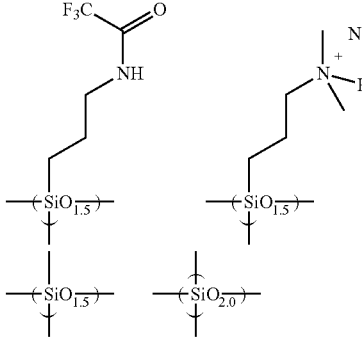
Formula (A10)
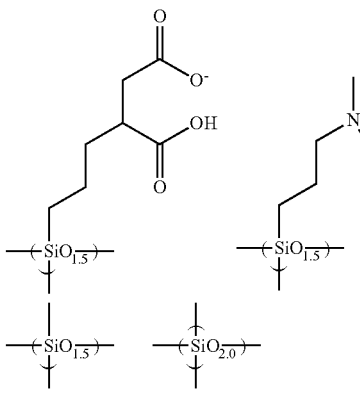
Formula (A-11)
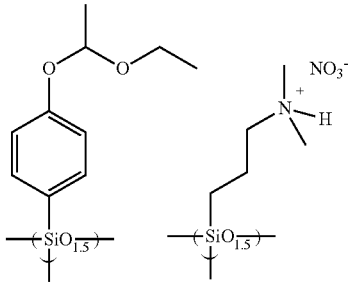

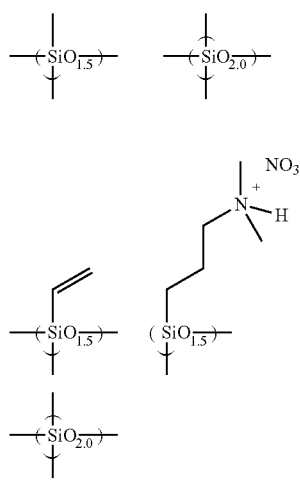
Formula (A-12)
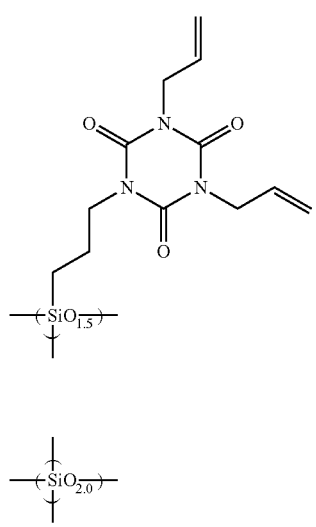
Formula (A-13)
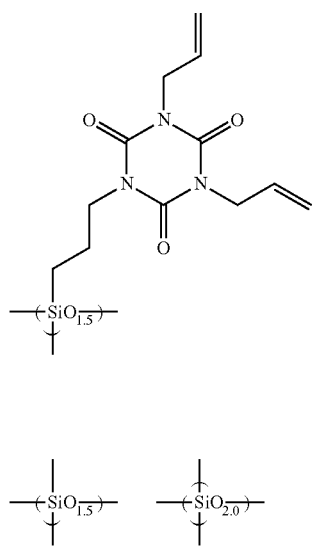
Formula (A-14)
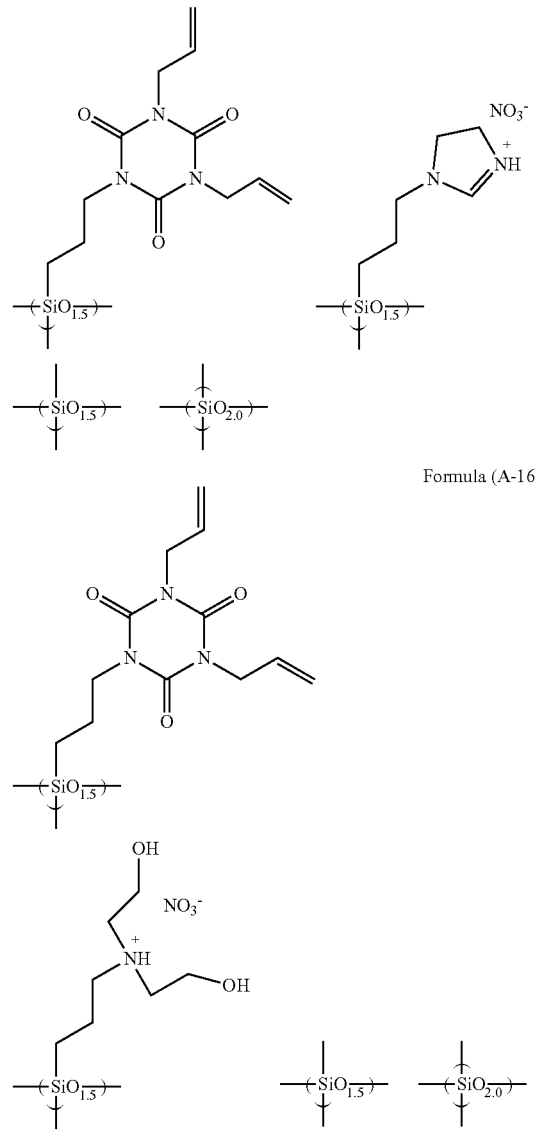

Formula (A18)

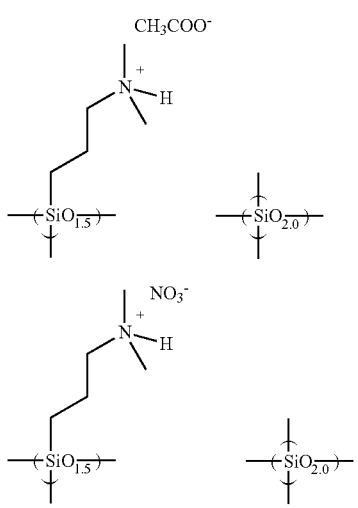

Formula (A-19)

Formula (C-1)
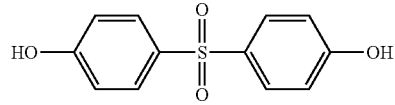

Formula (C-2)
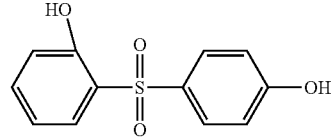

Formula (C-3)
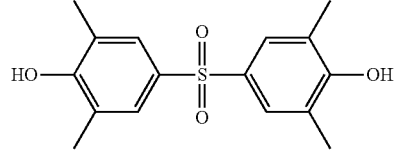

Formula (C-4)
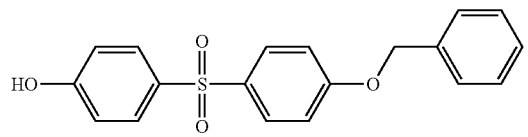

Formula (C-5)
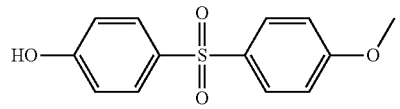

Formula (C-6)
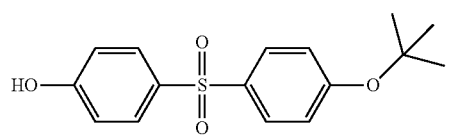

Formula (C-7)
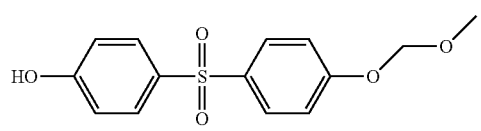

Formula (C-8)
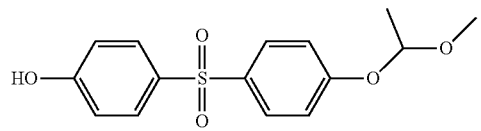

Formula (C-9)
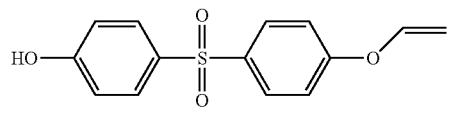

Formula (C-10)
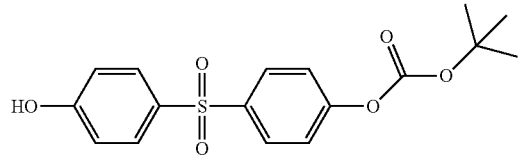

The hydrolysis condensate (polyorganosiloxane) of the aforementioned hydrolyzable silane has a weight average molecular weight of 1,000 to 1,000,000 or 1,000 to 100,000. The molecular weight is determined by GPC analysis in terms of polystyrene.

The GPC analysis can be performed under, for example, the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 ml/min, and polystyrene (available from Showa Denko K.K.) as a standard sample.

For the hydrolysis of an alkoxysilyl group, an acyloxysilyl group, or a halogenated silyl group, 0.5 to 100 mol (preferably 1 to 10 mol) of water is used per mol of the hydrolyzable group.

Furthermore, 0.001 to 10 mol (preferably 0.001 to 1 mol) of a hydrolysis catalyst may be used per mol of the hydrolyzable group.

The reaction temperature for hydrolysis and condensation is generally 20 to 80° C.

The hydrolysis may be completely or partially performed. Thus, a hydrolysis product or a monomer may remain in the resultant hydrolysis condensate.

A catalyst may be used for the hydrolysis and condensation. The catalyst may be a strong acid. Examples of the strong acid include inorganic acids or carboxylic acids having a pKa of 5 or less, such as hydrochloric acid, nitric acid, sulfuric acid, phosphoric acid, acetic acid, chloroacetic acid, dichloroacetic acid, trichloroacetic acid, trifluoroacetic acid, maleic acid, methanesulfonic acid, camphorsulfonic acid, and trifluoromethanesulfonic acid.

The organic solvent used for the hydrolysis is a non-alcoholic solvent and may be any of the above-exemplified ones.

In addition, bisphenol S or a bisphenol S derivative may be used as an additive. The amount of the bisphenol S or the bisphenol S derivative is 0.01 to 20 parts by mass, or 0.01 to 10 parts by mass, or 0.01 to 5 parts by mass relative to 100 parts by mass of the polyorganosiloxane.

Preferred examples of the bisphenol S or the bisphenol S derivative are as follows.

Formula (C-11)
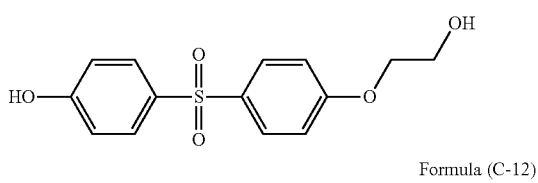

Formula (C-12)
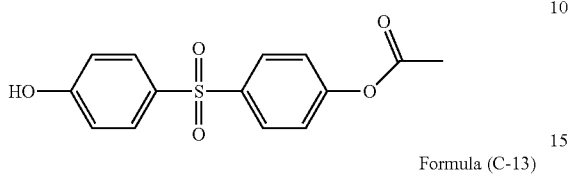

Formula (C-13)
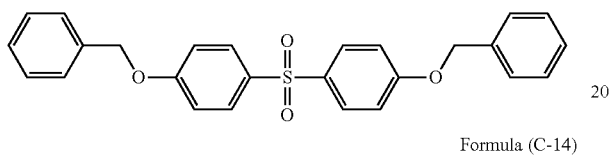

Formula (C-14)
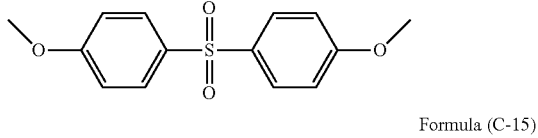

Formula (C-15)
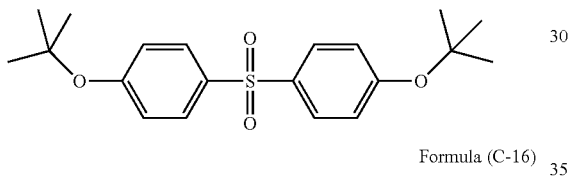

Formula (C-16)
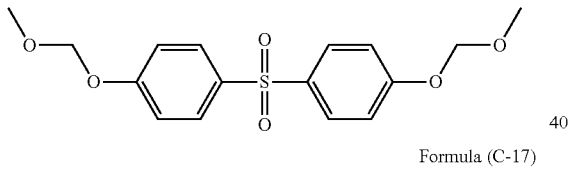

Formula (C-17)
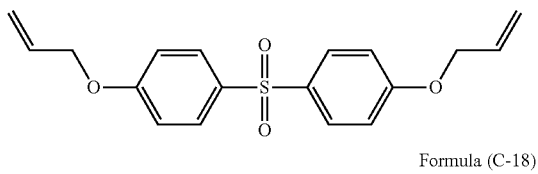

Formula (C-18)
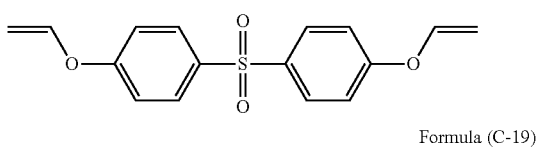

Formula (C-19)

Formula (C-20)

Formula (C-21)

Formula (C-22)

Formula (C-23)

The resist underlayer film-forming composition used in the present invention may contain a curing catalyst. The curing catalyst plays its own role during heating and curing of a coating film containing a polyorganosiloxane composed of a hydrolysis condensate.

The curing catalyst may be an ammonium salt, a phosphine, a phosphonium salt, or a sulfonium salt.

Examples of the ammonium salt include:
a quaternary ammonium salt having a structure of the following Formula (D-1):

Formula (D-1)

(wherein $m_1$ is an integer of 2 to 11; $n_1$ is an integer of 2 or 3; $R^{21}$ is an alkyl group or an aryl group; and $Y_A^-$ is an anion);

a quaternary ammonium salt having a structure of the following Formula (D-2):

$$R^{22}R^{23}R^{24}R^{25}N^+Y_A^-$$ Formula (D-2)

(wherein $R^{22}$, $R^{23}$, $R^{24}$, and $R^{25}$ are each an alkyl group or an aryl group; N is a nitrogen atom; $Y_A^-$ is an anion; and each of $R^{22}$, $R^{23}$, $R^{24}$, and $R^{25}$ is bonded to a nitrogen atom via a C—N bond);

a quaternary ammonium salt having a structure of the following Formula (D-3):

Formula (D-3)

(wherein $R^{26}$ and $R^{27}$ are each an alkyl group or an aryl group; and $Y_A^-$ is an anion);

a quaternary ammonium salt having a structure of the following Formula (D-4):

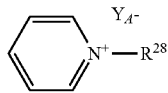
Formula (D-4)

(wherein $R^{28}$ is an alkyl group or an aryl group; and $Y_A^-$ is an anion);

a quaternary ammonium salt having a structure of the following Formula (D-5):

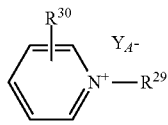
Formula (D-5)

(wherein $R^{29}$ and $R^{30}$ are each an alkyl group or an aryl group; and $Y_A^-$ is an anion); and a tertiary ammonium salt having a structure of the following Formula (D-6):

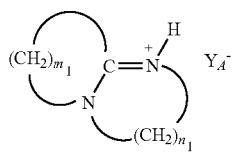
Formula (D-6)

(wherein $m_1$ is an integer of 2 to 11; $n_1$ is an integer of 2 or 3; H is a hydrogen atom; and $Y_A^-$ is an anion).

Examples of the phosphonium salt include a quaternary phosphonium salt of the following Formula (D-7):

$$R^{31}R^{32}R^{33}R^{34}P^+Y_A^-$$  Formula (D-7)

(wherein $R^{31}$, $R^{32}$, $R^{33}$, and $R^{34}$ are each an alkyl group or an aryl group; P is a phosphorus atom; $Y_A^-$ is an anion; and each of $R^{31}$, $R^{32}$, $R^{33}$, and $R^{34}$ is bonded to a phosphorus atom via a C—P bond).

Examples of the sulfonium salt include a tertiary sulfonium salt of the following Formula (D-8):

$$R^{35}R^{36}R^{37}S^+Y_A^-$$  Formula (D-8)

(wherein $R^{35}$, $R^{36}$ and $R^{37}$ are each an alkyl group or an aryl group; S is a sulfur atom; $Y_A^-$ is an anion; and each of $R^{35}$, $R^{36}$, and $R^{37}$ is bonded to a sulfur atom via a C—S bond).

The compound of Formula (D-1) is a quaternary ammonium salt derived from an amine. In Formula (D-1), $m_1$ is an integer of 2 to 11, and $n_1$ is an integer of 2 or 3. $R^{21}$ of the quaternary ammonium salt is a $C_{1-18}$ alkyl or aryl group, preferably a $C_{2-10}$ alkyl or aryl group. Examples of $R^{21}$ include linear alkyl groups, such as ethyl group, propyl group, and butyl group, benzyl group, cyclohexyl group, cyclohexylmethyl group, and dicyclopentadienyl group. Examples of the anion ($Y_A^-$) include halogen ions, such as chlorine ion (Cl$^-$), bromine ion (Br$^-$), and iodine ion (I$^-$); and acid groups, such as carboxylate (—COO$^-$), sulfonate (—SO$_3^-$), and alcoholate (—O$^-$).

The compound of Formula (D-2) is a quaternary ammonium salt having a structure of $R^{22}R^{23}R^{24}R^{25}N^+Y_A^-$. $R^{22}$, $R^{23}$, $R^{24}$, and $R^{25}$ of the quaternary ammonium salt are each a $C_{1-18}$ alkyl or aryl group, or a silane compound bonded to a silicon atom via an Si—C bond. Examples of the anion ($Y_A^-$) include halogen ions, such as chlorine ion (Cl$^-$), bromine ion (Br$^-$), and iodine ion (I$^-$); and acid groups, such as carboxylate (—COO$^-$), sulfonate (—SO$_3^-$), and alcoholate (—O$^-$). The quaternary ammonium salt is commercially available, and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. In Formula (D-3), $R^{26}$ and $R^{27}$ are each a $C_{1-18}$ alkyl or aryl group, and the total number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y_A^-$) include halogen ions, such as chlorine ion (Cl$^-$), bromine ion (Br$^-$), and iodine ion (I$^-$); and acid groups, such as carboxylate (—COO$^-$), sulfonate (—SO$_3^-$), and alcoholate (—O$^-$). Although this compound is commercially available, the compound can be produced through, for example, reaction between an imidazole compound (e.g., 1-methylimidazole or 1-benzylimidazole) and an alkyl or aryl halide (e.g., benzyl bromide or methyl bromide).

The compound of Formula (D-4) is a quaternary ammonium salt derived from pyridine. In Formula (D-4), $R^{28}$ is a $C_{1-18}$ alkyl or aryl group, preferably a $C_4$-18 alkyl or aryl group. Examples of $R^{28}$ include butyl group, octyl group, benzyl group, and lauryl group. Examples of the anion ($Y_A^-$) include halogen ions, such as chlorine ion (Cl$^-$), bromine ion (Br$^-$), and iodine ion (I$^-$); and acid groups, such as carboxylate (—COO$^-$), sulfonate (—SO$_3^-$), and alcoholate (—O$^-$). Although this compound is commercially available, the compound can be produced through, for example, reaction between pyridine and an alkyl or aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) is a quaternary ammonium salt derived from a substituted pyridine, such as picoline. In Formula (D-5), $R^{29}$ is a $C_{1-18}$ alkyl or aryl group, preferably a $C_{4-18}$ alkyl or aryl group. Examples of $R^{29}$ include methyl group, octyl group, lauryl group, and benzyl group. $R^{30}$ is a $C_{1-18}$ alkyl or aryl group, and, for example, $R^{30}$ is a methyl group when the compound is a quaternary ammonium derived from picoline. Examples of the anion ($Y_A^-$) include halogen ions, such as chlorine ion (Cl$^-$), bromine ion (Br$^-$), and iodine ion (I$^-$); and acid groups, such as carboxylate (—COO$^-$), sulfonate (—SO$_3^-$), and alcoholate (—O$^-$). Although this compound is commercially available, the compound can be produced through, for example, reaction between a substituted pyridine (e.g., picoline) and an alkyl or aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine. In Formula (D-6), $m_1$ is an integer of 2 to 11, and $n_1$ is an integer of 2 or 3. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻). The compound can be produced through, for example, reaction between an amine and a weak acid, such as a carboxylic acid or phenol. Examples of the carboxylic acid include formic acid and acetic acid. When formic acid is used, the anion ($Y_A^-$) is (HCOO⁻). When acetic acid is used, the anion ($Y_A^-$) is (CH₃COO⁻). When phenol is used, the anion ($Y_A^-$) is (C₆H₅O⁻).

The compound of Formula (D-7) is a quaternary phosphonium salt having a structure of $R^{31}R^{32}R^{33}R^{34}P^+Y^-$. $R^{31}$, $R^{32}$, $R^{33}$, and $R^{34}$ are each a $C_{1-18}$ alkyl or aryl group, or a silane compound bonded to a silicon atom via an Si—C bond. Three of the four substituents $R^{31}$ to $R^{34}$ are preferably a phenyl group or a substituted phenyl group, such as a phenyl group or a tolyl group. The remaining one substituent is a $C_{1-18}$ alkyl or aryl group, or a silane compound bonded to a silicon atom via an Si—C bond. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻).

This compound is commercially available, and examples of the compound include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; and tritolylmonoalkylphosphonium halides (wherein the halogen atom is a chlorine atom or a bromine atom). Particularly preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of the phosphine include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) is a tertiary sulfonium salt having a structure of $R^{35}R^{36}R^{37}S^+Y^-$. $R^{35}$, $R^{36}$, and $R^{37}$ are each a $C_{1-18}$ alkyl or aryl group, or a silane compound bonded to a silicon atom via an Si—C bond. Three of the four substituents $R^{35}$ to $R^{37}$ are preferably a phenyl group or a substituted phenyl group, such as a phenyl group or a tolyl group. The remaining one substituent is a $C_{1-18}$ alkyl or aryl group. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻).

This compound is commercially available, and examples of the compound include tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); tetraalkylphosphonium carboxylates, such as tri-n-butylsulfonium carboxylate and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. Triphenylsulfonium halides and triphenylsulfonium carboxylate are preferably used.

The amount of the curing catalyst is 0.01 to 10 parts by mass, or 0.01 to 5 parts by mass, or 0.01 to 3 parts by mass relative to 100 parts by mass of the polyorganosiloxane.

From a hydrolysis condensate (polymer) prepared by hydrolysis and condensation of a hydrolyzable silane with a catalyst in a solvent, alcohols (i.e., by-products), the used hydrolysis catalyst, and water can be simultaneously removed by, for example, distillation under reduced pressure. Furthermore, an acid or base catalyst used in the hydrolysis can be removed by neutralization or ion exchange. In the case of the resist underlayer film-forming composition for lithography used in the present invention, an organic acid, water, an alcohol, or a combination thereof may be added to the resist underlayer film-forming composition containing the hydrolysis condensate for stabilization of the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Of these, oxalic acid, maleic acid, etc. are preferred. The amount of the organic acid added is 0.1 to 5.0 parts by mass relative to 100 parts by mass of the condensate (polyorganosiloxane). For example, pure water, ultrapure water, or ion-exchange water may be added to the composition, and the amount of the water added may be 1 to 20 parts by mass relative to 100 parts by mass of the resist underlayer film-forming composition.

The alcohol added to the composition is preferably an alcohol that easily dissipates by heating after the application of the composition. Examples of the alcohol include methanol, ethanol, propanol, isopropanol, and butanol. The amount of the alcohol added may be 1 to 20 parts by mass relative to 100 parts by mass of the resist underlayer film-forming composition.

The underlayer film-forming composition for lithography of the present invention may optionally contain, besides the aforementioned components, for example, a photoacid generator and a surfactant.

The resist underlayer film-forming composition of the present invention may contain an acid generator.

Examples of the acid generator include a thermal acid generator and a photoacid generator.

A photoacid generator generates an acid during the exposure of a resist. Thus, the acidity of an underlayer film can be adjusted. This is one method for adjusting the acidity of the underlayer film to the acidity of a resist serving as an upper layer of the underlayer film. Furthermore, the adjustment of the acidity of the underlayer film enables the control of the pattern shape of a resist formed as an upper layer of the underlayer film.

Examples of the photoacid generator contained in the resist underlayer film-forming composition of the present invention include an onium salt compound, a sulfonimide compound, and a disulfonyldiazomethane compound.

Examples of the onium salt compound include iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

A single photoacid generator may be used alone, or two or more photoacid generators may be used in combination. When the photoacid generator is used, the amount thereof is 0.01 to 5 parts by mass, or 0.1 to 3 parts by mass, or 0.5 to 1 part by mass relative to 100 parts by mass of the condensate (polyorganosiloxane).

A surfactant effectively suppresses formation of, for example, pinholes and striations during application of the resist underlayer film-forming composition for lithography of the present invention to a substrate.

Examples of the surfactant contained in the resist underlayer film-forming composition of the present invention include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP EF301, EF303, and EF352 (available from Tohkem Products Corporation), trade names MEGAFAC F171, F173, R-08, and R-30 (available from DIC Corporation), Fluorad FC430 and FC431 (available from Sumitomo 3M Limited), trade name Asahi Guard AG710 and trade names SURFLON S-382, SC101, SC102, SC103, SC104, SC105, and SC106 (available from Asahi Glass Co., Ltd.); and Organosiloxane Polymer KP341 (available from Shin-Etsu Chemical Co., Ltd.). These surfactants may be used alone or in combination of two or more species. When the surfactant is used, the amount thereof is 0.0001 to 5 parts by mass, or 0.001 to 1 part by mass, or 0.01 to 0.5 parts by mass relative to 100 parts by mass of the condensate (polyorganosiloxane).

The resist underlayer film-forming composition used in the present invention may also contain, for example, a rheology controlling agent and an adhesion aid. The rheology controlling agent is effective for improving the fluidity of the underlayer film-forming composition. The adhesion aid is effective for improving the adhesion between a semiconductor substrate, an organic underlayer film, or a resist and a resist underlayer film.

No particular limitation is imposed on the solvent used in the resist underlayer film-forming composition used in the present invention, so long as the solvent can dissolve the aforementioned solid component. Examples of such a solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more species.

Next will be described the use of the resist underlayer film-forming composition used in the present invention.

The resist underlayer film-forming composition of the present invention is applied onto a substrate used for the production of a semiconductor device (e.g., a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by baking of the composition, to thereby form a resist underlayer film. The baking is performed under appropriately determined conditions; i.e., a baking temperature of 80° C. to 250° C. and a baking time of 0.3 to 60 minutes. Preferably, the baking temperature is 150° C. to 250° C., and the baking time is 0.5 to 2 minutes.

The thickness of the thus-formed underlayer film is, for example, 10 to 1,000 nm, or 20 to 500 nm, or 50 to 300 nm, or 100 to 200 nm.

In the present invention, the resist underlayer film is an EUV resist underlayer film, and the resist underlayer film may have a thickness of 1 nm to 30 nm, or 1 nm to 20 nm, or 1 nm to 5 nm.

Subsequently, for example, a photoresist layer is formed on the resist underlayer film. The photoresist layer can be formed by a well-known process; i.e., application of a photoresist composition solution onto the underlayer film and baking. The thickness of the photoresist layer is, for example, 50 to 10,000 nm, or 100 to 2,000 nm, or 200 to 1,000 nm.

In the present invention, an organic underlayer film can be formed on a substrate, the resist underlayer film used in the present invention can then be formed on the organic underlayer film, and then the resist underlayer film can be coated with a photoresist. This process can narrow the pattern width of the photoresist. Thus, even when the photoresist is applied thinly for preventing pattern collapse, the substrate can be processed through selection of an appropriate etching gas. For example, the resist underlayer film used in the present invention can be processed by using, as an etching gas, a fluorine-containing gas that achieves a sufficiently high etching rate for the photoresist. The organic underlayer film can be processed by using, as an etching gas, an oxygen-containing gas that achieves a sufficiently high etching rate for the resist underlayer film used in the present invention. The substrate can be processed by using, as an etching gas, a fluorine-containing gas that achieves a sufficiently high etching rate for the organic underlayer film.

No particular limitation is imposed on the photoresist formed on the resist underlayer film used in the present invention, so long as the photoresist is sensitive to light used for exposure. The photoresist may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase an alkali dissolution rate and a photoacid generator; a chemically amplified photoresist formed of a low-molecular-weight compound that decomposes with an acid to thereby increase an alkali dissolution rate of the photoresist, an alkali-soluble binder, and a photoacid generator; and a chemically amplified photoresist formed of a binder having a group that decomposes with an acid to thereby increase an alkali dissolution rate, a low-molecular-weight compound that decomposes with an acid to thereby increase the alkali dissolution rate of the photoresist, and a photoacid generator. Specific examples of the photoresist include trade name APEX-E, available from Shipley, trade name PAR710, available from Sumitomo Chemical Company, Limited, and trade name SEPR430, available from Shin-Etsu Chemical Co., Ltd. Other examples of the photoresist include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Subsequently, light exposure is performed through a predetermined mask in the present invention. The light exposure may involve the use of, for example, a KrF excimer laser (wavelength: 248 nm), an ArF excimer laser (wavelength: 193 nm), and an F2 excimer laser (wavelength: 157 nm). After the light exposure, post exposure bake may optionally be performed. The post exposure bake is performed under appropriately determined conditions; i.e., a heating temperature of 70° C. to 150° C. and a heating time of 0.3 to 10 minutes.

In the present invention, a resist for electron beam lithography or a resist for EUV lithography may be used instead of the photoresist. The electron beam resist may be either of negative and positive resists. Examples of the electron beam resist include a chemically amplified resist formed of an acid generator and a binder having a group that decomposes with an acid to thereby change an alkali dissolution rate; a chemically amplified resist formed of an alkali-soluble binder, an acid generator, and a low-molecular-weight compound that decomposes with an acid to thereby change an alkali dissolution rate of the resist; a chemically amplified resist formed of an acid generator, a binder having a group that decomposes with an acid to thereby change an alkali dissolution rate, and a low-molecular-weight compound that decomposes with an acid to thereby change the alkali dissolution rate of the resist; a non-chemically amplified resist formed of a binder having a group that decomposes with electron beams to thereby change an alkali dissolution rate; and a non-chemically amplified resist formed of a binder having a moiety that is cut with electron beams to thereby change an alkali dissolution rate. Also in the case of use of such an electron beam resist, a resist pattern can be formed by using electron beams as an irradiation source in the same manner as in the case of using the photoresist.

The EUV resist may be a methacrylate resin-based resist.

Subsequently, development is performed with a developer (e.g., an alkaline developer). When, for example, a positive photoresist is used, an exposed portion of the photoresist is removed to thereby form a pattern of the photoresist.

Examples of the developer include alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine. Such a developer may also contain, for example, a surfactant. The development is performed under appropriately determined conditions; i.e., a temperature of 5 to 50° C. and a time of 10 to 600 seconds.

In the present invention, the developer may be an organic solvent. After the light exposure, the development is performed with a developer (a solvent). When, for example, a positive photoresist is used, an unexposed portion of the photoresist is removed to thereby form a pattern of the photoresist.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Such a developer may also contain, for example, a surfactant. The development is performed under appropriately determined conditions; i.e., a temperature of 5 to 50° C. and a time of 10 to 600 seconds.

The resultant patterned photoresist (upper layer) is used as a protective film for removing the resist underlayer film (intermediate layer) of the present invention. Subsequently, the patterned photoresist and the patterned resist underlayer film (intermediate layer) of the present invention are used as protective films for removing the organic underlayer film (lower layer). Finally, the patterned resist underlayer film (intermediate layer) of the present invention and the patterned organic underlayer film (lower layer) are used as protective films for processing the semiconductor substrate.

Specifically, a photoresist-removed portion of the resist underlayer film (intermediate layer) of the present invention is removed by dry etching to thereby expose the semiconductor substrate. The dry etching of the resist underlayer film of the present invention can be performed with any of gasses, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane. The dry etching of the resist underlayer film is preferably performed with a halogen-containing gas. In general, a photoresist formed of an organic substance is hard to be removed by dry etching with a halogen-containing gas. In contrast, the resist underlayer film of the present invention, which contains numerous silicon atoms, is quickly removed by dry etching with a halogen-containing gas. Therefore, a reduction in the thickness of the photoresist in association with the dry etching of the resist underlayer film can be suppressed. Thus, the photoresist can be used in the form of thin film. The dry etching of the resist underlayer film is preferably performed with a fluorine-containing gas. Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

Thereafter, the patterned photoresist and the patterned resist underlayer film of the present invention are used as protective films for removing the organic underlayer film. The dry etching of the organic underlayer film (lower layer) is preferably performed with an oxygen-containing gas, since the resist underlayer film of the present invention, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas. Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

The processing of the substrate may be performed by ion implantation.

After the processing of the substrate, a step of removing a mask layer with a hydrogen peroxide-containing chemical is performed, to thereby produce a semiconductor device. The mask layer is an organic underlayer film including the resist or the resist underlayer film.

In the present invention, an organic anti-reflective coating may be formed on the resist underlayer film before formation of the photoresist. No particular limitation is imposed on the composition used for formation of the anti-reflective coating, and the composition may be appropriately selected from anti-reflective coating compositions that have been conventionally used in a lithography process. The anti-reflective coating can be formed by a commonly used method, for example, application of the composition with a spinner or a coater, and baking of the composition.

In the present invention, the substrate to which the resist underlayer film-forming composition is applied may have an organic or inorganic anti-reflective coating formed thereon by, for example, a CVD process. The underlayer film of the present invention may be formed on the anti-reflective coating.

In the present invention, the resist underlayer film formed from the resist underlayer film-forming composition may absorb light used in a lithography process depending on the wavelength of the light. In such a case, the resist underlayer film can function as an anti-reflective coating having the effect of preventing reflection of light from the substrate. Furthermore, the resist underlayer film used in the present invention can be used as, for example, a layer for preventing an interaction between the substrate and the photoresist; a layer having a function of preventing the adverse effect, on the substrate, of a material used for the photoresist or a substance generated during the exposure of the photoresist to light; a layer having a function of preventing diffusion of a substance generated from the substrate during heating and baking to the photoresist serving as an upper layer; and a barrier layer for reducing a poisoning effect of a dielectric layer of the semiconductor substrate on the photoresist layer.

The resist underlayer film formed from the resist underlayer film-forming composition can be applied to a substrate having via holes for use in a dual damascene process, and can be used as an embedding material to fill up the holes. The resist underlayer film can also be used as a planarization material for planarizing the surface of a semiconductor substrate having irregularities.

The resist underlayer film can function not only as a hard mask, but also as an EUV resist underlayer film for the purpose described below. Specifically, the resist underlayer film-forming composition can be used for an anti-reflective EUV resist underlayer coating capable of, without intermixing with an EUV resist, preventing the reflection, from a substrate or an interface, of exposure light undesirable for EUV exposure (wavelength: 13.5 nm); for example, the aforementioned UV or DUV (ArF laser light, KrF laser light). Thus, the reflection can be efficiently prevented in the underlayer of the EUV resist. When the resist underlayer film is used as an EUV resist underlayer film, the film can be processed in the same manner as in the photoresist underlayer film.

EXAMPLES

Synthesis Example 1

A 300-ml flask was charged with 22.3 g of tetraethoxysilane, 6.5 g of methyltriethoxysilane, 3.2 g of triethoxysilylpropyldiallyl isocyanurate, and 48.5 g of acetone. While the mixture was stirred with a magnetic stirrer, a mixture of 19.2 g of 0.2 M aqueous nitric acid solution and 0.32 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-1). The polymer was found to have a weight average molecular weight Mw of 1,500 as determined by GPC in terms of polystyrene.

Synthesis Example 2

A 300-ml flask was charged with 23.1 g of tetraethoxysilane, 6.8 g of methyltriethoxysilane, 1.9 g of glycidoxypropyltrimethoxysilane, and 48.1 g of acetone. While the mixture was stirred with a magnetic stirrer, a mixture of 19.8 g of 0.2 M aqueous nitric acid solution and 0.32 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-2). The polymer was found to have a weight average molecular weight Mw of 2,000 as determined by GPC in terms of polystyrene.

Synthesis Example 3

A 300-ml flask was charged with 22.6 g of tetraethoxysilane, 6.6 g of methyltriethoxysilane, 2.7 g of phenylsulfonylpropyltriethoxysilane, and 48.4 g of acetone. While the mixture was stirred with a magnetic stirrer, a mixture of 19.4 g of 0.2 M aqueous nitric acid solution and 0.32 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-3). The polymer was found to have a weight average molecular weight Mw of 1,800 as determined by GPC in terms of polystyrene.

Synthesis Example 4

A 300-ml flask was charged with 23.0 g of tetraethoxysilane, 6.8 g of methyltriethoxysilane, 2.0 g of bicyclo(2,2,1)hept-5-en-yltriethoxysilane, and 48.2 g of acetone. While the mixture was stirred with a magnetic stirrer, a mixture of 19.7 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-4). The polymer was found to have a weight average molecular weight Mw of 2,000 as determined by GPC in terms of polystyrene.

Synthesis Example 5

A 300-ml flask was charged with 23.1 g of tetraethoxysilane, 6.8 g of methyltriethoxysilane, 1.9 g of cyclohexylepoxyethyltrimethoxysilane, and 48.1 g of acetone. While the mixture was stirred with a magnetic stirrer, a mixture of 19.8 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-5). The polymer was found to have a weight average molecular weight Mw of 2,000 as determined by GPC in terms of polystyrene.

Synthesis Example 6

A 300-ml flask was charged with 22.7 g of tetraethoxysilane, 6.7 g of methyltriethoxysilane, 2.5 g of phenylsulfonamidopropyltrimethoxysilane, and 48.1 g of acetone. While the mixture was stirred with a magnetic stirrer, a mixture of 19.5 g of 0.2 M aqueous nitric acid solution and 0.32 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-6). The polymer was found to have a weight average molecular weight Mw of 2,000 as determined by GPC in terms of polystyrene.

Synthesis Example 7

A 300-ml flask was charged with 23.2 g of tetraethoxysilane, 6.8 g of methyltriethoxysilane, 1.6 g of cyclohexyltrimethoxysilane, and 48.0 g of acetone. While the mixture was stirred with a magnetic stirrer, a mixture of 19.9 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-7). The polymer was found to have a weight average molecular weight Mw of 1,500 as determined by GPC in terms of polystyrene.

Synthesis Example 8

A 300-ml flask was charged with 23.4 g of tetraethoxysilane, 8.3 g of methyltriethoxysilane, and 48.0 g of acetone. While the mixture was stirred with a magnetic stirrer, a mixture of 20.0 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-8). The polymer was found to have a weight average molecular weight Mw of 1,700 as determined by GPC in terms of polystyrene.

Synthesis Example 9

A 300-ml flask was charged with 22.9 g of tetraethoxysilane, 6.7 g of methyltriethoxysilane, 2.2 g of trifluoroacetamidopropyltriethoxysilane, and 48.2 g of acetone. While the mixture was stirred with a magnetic stirrer, a mixture of 19.6 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-9). The polymer was found to have a weight average molecular weight Mw of 1,800 as determined by GPC in terms of polystyrene.

Synthesis Example 10

A 300-ml flask was charged with 22.8 g of tetraethoxysilane, 6.7 g of methyltriethoxysilane, 2.4 g of succinic anhydride-propyltriethoxysilane, and 48.3 g of acetone. While the mixture was stirred with a magnetic stirrer, a mixture of 19.5 g of 0.2 M aqueous nitric acid solution and 0.32 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-10). The polymer was found to have a weight average molecular weight Mw of 1,600 as determined by GPC in terms of polystyrene.

Synthesis Example 11

A 300-ml flask was charged with 22.9 g of tetraethoxysilane, 6.7 g of methyltriethoxysilane, 2.2 g of p-ethoxyethoxyphenyltrimethoxysilane, and 48.2 g of acetone. While the mixture was stirred with a magnetic stirrer, a mixture of 19.6 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-11). The polymer was found to have a weight average molecular weight Mw of 1,600 as determined by GPC in terms of polystyrene.

Synthesis Example 12

A 300-ml flask was charged with 23.5 g of tetraethoxysilane, 6.9 g of methyltriethoxysilane, 1.2 g of vinyltrimethoxysilane, and 47.9 g of acetone. While the mixture was stirred with a magnetic stirrer, a mixture of 20.2 g of 0.2 M aqueous nitric acid solution and 0.33 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-12). The polymer was found to have a weight average molecular weight Mw of 2,000 as determined by GPC in terms of polystyrene.

Synthesis Example 13

A 300-ml flask was charged with 23.1 g of tetraethoxysilane, 5.7 g of methyltriethoxysilane, and 48.0 g of acetone. While the mixture was stirred with a magnetic stirrer, a mixture of 20.0 g of 2 M aqueous nitric acid solution and 3.3 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-8). The polymer was found to have a weight average molecular weight Mw of 2,800 as determined by GPC in terms of polystyrene.

Synthesis Example 14

A 300-ml flask was charged with 18.3 g of tetraethoxysilane, 15.1 g of triethoxysilylpropyldiallyl isocyanurate, and 50.6 g of acetone. While the mixture was stirred with a magnetic stirrer, a mixture of 15.7 g of 0.2 M aqueous nitric acid solution and 0.26 g of dimethylaminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-13). The polymer was found to have a weight average molecular weight Mw of 1,500 as determined by GPC in terms of polystyrene.

Synthesis Example 15

A 300-ml flask was charged with 22.3 g of tetraethoxysilane, 6.6 g of methyltriethoxysilane, 3.2 g of triethoxysilyl-propyldiallyl isocyanurate, and 48.5 g of acetone. While the mixture was stirred with a magnetic stirrer, a mixture of 19.2 g of 0.2 M aqueous nitric acid solution and 0.27 g of aminopropyltrimethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-14). The polymer was found to have a weight average molecular weight Mw of 2,500 as determined by GPC in terms of polystyrene.

Synthesis Example 16

A 300-ml flask was charged with 22.3 g of tetraethoxysilane, 6.5 g of methyltriethoxysilane, 3.2 g of triethoxysilylpropyldiallyl isocyanurate, and 48.6 g of acetone. While the mixture was stirred with a magnetic stirrer, a mixture of 19.1 g of 0.2 M aqueous nitric acid solution and 0.42 g of 4,5-dihydroxyimidazole propyltriethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-15). The polymer was found to have a weight average molecular weight Mw of 2,000 as determined by GPC in terms of polystyrene.

Synthesis Example 17

A 300-ml flask was charged with 22.2 g of tetraethoxysilane, 6.5 g of methyltriethoxysilane, 3.2 g of triethoxysilylpropyldiallyl isocyanurate, and 48.6 g of acetone. While the mixture was stirred with a magnetic stirrer, a mixture of 19.1 g of 0.2 M aqueous nitric acid solution and 0.47 g of bishydroxyethylaminopropyltriethoxysilane was added dropwise to the flask. After completion of the dropwise addition, the flask was transferred to an oil bath set at 85° C., and the mixture was refluxed for 240 minutes. Thereafter, 64 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C. while a solvent proportion of propylene glycol monomethyl ether was 100%. The resultant polymer corresponds to Formula (A-16). The polymer was found to have a weight average molecular weight Mw of 1,800 as determined by GPC in terms of polystyrene.

Synthesis Example 18

A 500-ml flask was charged with 91.16 g of water. While the mixture was stirred with a magnetic stirrer, 22.23 g of dimethylaminopropyltrimethoxysilane and 8.16 g of triethoxysilylpropylsuccinic anhydride were added dropwise to the mixture. After completion of the dropwise addition, the flask was transferred to an oil bath set at 40° C., and reaction was allowed to proceed for 240 minutes. Thereafter, the reaction mixture was cooled to room temperature, and 91.16 g of water was added to the reaction mixture. Methanol (i.e., a reaction by-product) and water were then distilled off under reduced pressure, followed by concentration, to thereby prepare an aqueous solution of a hydrolysis condensate (polysiloxane). Subsequently, water was added to the aqueous solution so as to achieve a solid residue content of 20% by mass at 140° C. while a solvent proportion of water was 100% (solvent: water only). The resultant polymer corresponds to Formula (A-17). The polymer was found to have a weight average molecular weight Mw of 3,300 as determined by GPC in terms of polyethylene glycol.

Synthesis Example 19

A 500-ml flask was charged with 16.84 g of acetic acid, 70.11 of water, and 70.11 g of acetone. While the mixture was stirred with a magnetic stirrer, 23.26 g of dimethylaminopropyltrimethoxysilane was added dropwise to the mixture. Thereafter, the resultant mixture was added to 15.58 g of tetraethoxysilane. The flask was then transferred to an oil bath set at 110° C., and reaction was allowed to proceed for 240 minutes. Thereafter, the reaction mixture was cooled to room temperature, and 116.51 g of water was added to the reaction mixture. Ethanol (i.e., a reaction by-product) and water were then distilled off under reduced pressure, followed by concentration, to thereby prepare an aqueous solution of a hydrolysis condensate (polysiloxane). Subsequently, water was added to the aqueous solution so as to achieve a solid residue content of 20% by mass at 140° C. while a solvent proportion of water was 100% (solvent: water only). The resultant polymer corresponds to Formula (A-18). The polymer was found to have a weight average molecular weight Mw of 1,000 as determined by GPC in terms of polyethylene glycol.

Synthesis Example 20

A 500-ml flask was charged with 25.24 g of 70% nitric acid, 70.11 g of water, and 70.11 g of acetone. While the mixture was stirred with a magnetic stirrer, 23.26 g of dimethylaminopropyltrimethoxysilane was added dropwise to the mixture. Thereafter, the resultant mixture was added to 15.58 g of tetraethoxysilane. The flask was then transferred to an oil bath set at 110° C., and reaction was allowed to proceed for 240 minutes. Thereafter, the reaction mixture was cooled to room temperature, and 143.87 g of water was added to the reaction mixture. Ethanol (i.e., a reaction by-product) and water were then distilled off under reduced pressure, followed by concentration, to thereby prepare an aqueous solution of a hydrolysis condensate (polysiloxane). Subsequently, water was added to the aqueous solution so as to achieve a solid residue content of 20% by mass at 140° C. while a solvent proportion of water was 100% (solvent: water only). The resultant polymer corresponds to Formula (A-19). The polymer was found to have a weight average molecular weight Mw of 800 as determined by GPC in terms of polyethylene glycol.

Synthesis Example 21

A 500-ml flask was charged with 10.78 g of acetic acid, 44.90 g of water, and 44.90 g of acetone. While the mixture was stirred with a magnetic stirrer, 14.89 g of dimethylaminopropyltrimethoxysilane was added dropwise to the mixture. Thereafter, the resultant mixture was added to 34.92 g of tetraethoxysilane. The flask was then transferred to an oil bath set at 110° C., and reaction was allowed to proceed for 240 minutes. Thereafter, the reaction mixture was cooled to room temperature, and 149.43 g of water was added to the reaction mixture. Ethanol (i.e., a reaction by-product) and water were then distilled off under reduced pressure, followed by concentration, to thereby prepare an aqueous solution of a hydrolysis condensate (polysiloxane). Subsequently, water was added to the aqueous solution so as to achieve a solid residue content of 20% by mass at 140° C. while a solvent proportion of water was 100% (solvent: water only). The resultant polymer corresponds to Formula (A-18). The polymer was found to have a weight average molecular weight Mw of 1,200 as determined by GPC in terms of polyethylene glycol.

Synthesis Example 22

A 500-ml flask was charged with 16.16 g of 70% nitric acid, 44.90 g of water, and 44.90 g of acetone. While the mixture was stirred with a magnetic stirrer, 14.89 g of dimethylaminopropyltrimethoxysilane was added dropwise to the mixture. Thereafter, the resultant mixture was added to 34.92 g of tetraethoxysilane. The flask was then transferred to an oil bath set at 110° C., and reaction was allowed to proceed for 240 minutes. Thereafter, the reaction mixture was cooled to room temperature, and 149.43 g of water was added to the reaction mixture. Ethanol (i.e., a reaction by-product) and water were then distilled off under reduced pressure, followed by concentration, to thereby prepare an aqueous solution of a hydrolysis condensate (polysiloxane). Subsequently, water was added to the aqueous solution so as to achieve a solid residue content of 20% by mass at 140° C. while a solvent proportion of water was 100% (solvent: water only). The resultant polymer corresponds to Formula (A-19). The polymer was found to have a weight average molecular weight Mw of 1,000 as determined by GPC in terms of polyethylene glycol.

Comparative Synthesis Example 1

A 300-ml flask was charged with 24.1 g of tetraethoxysilane, 1.8 g of phenyltrimethoxysilane, 9.5 g of triethoxymethylsilane, and 53.0 g of acetone. While the mixture was stirred with a magnetic stirrer, 11.7 g of 0.01 M aqueous hydrochloric acid solution was added dropwise to the mixture. After completion of the dropwise addition, the flask was transferred to an oil bath set at 85° C., and the mixture was refluxed for 240 minutes. Thereafter, 70 g of propylene glycol monomethyl ether was added to the mixture, and then acetone, methanol, ethanol, and water were distilled off under reduced pressure, followed by concentration, to thereby prepare an aqueous solution of a hydrolysis condensate (polymer). Subsequently, propylene glycol monomethyl ether was added to the aqueous solution so as to achieve a solid residue content of 13% by weight at 140° C.

The resultant polymer corresponds to the following Formula (E-1). The polymer was found to have a weight average molecular weight Mw of 1,400 as determined by GPC in terms of polystyrene.

Formula (E-1)

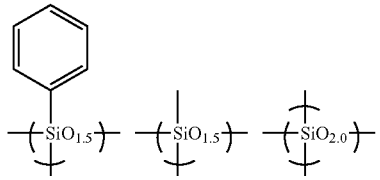

(Preparation of Resist Underlayer Film-Forming Composition)

Each of the polysiloxanes (polymers) prepared in the aforementioned Synthesis Examples, an acid, and a solvent were mixed in proportions shown in Table 1, and the resultant mixture was filtered with a fluororesin-made filter (0.1 μm), to thereby prepare a resist underlayer film-forming composition. The amount of each polymer shown in Table 1 corresponds not to the amount of the polymer solution, but to the amount of the polymer itself.

The water used in Examples was ultrapure water. In the following Tables, the amount of each component is represented by "parts by mass." In the following Tables, MA denotes maleic acid; NfA, nonafluorobutanesulfonic acid; APTEOS, aminopropyltrimethoxysilane; TPSCS, triphenylsulfonium camphorsulfonate; TPSNO3, triphenylsulfonium nitrate; PGMEA, propylene glycol monomethyl ether acetate; PGEE, propylene glycol monoethyl ether, PGME, propylene glycol monomethyl ether; and DIW, water.

TABLE 1

|  | Si polymer solution | Additive 1 | Additive 2 | Solvent | | | |
|---|---|---|---|---|---|---|---|
| Example 1 | Synthesis | MA |  | PGEE | PGMEA | PGME | DIW |
| (parts by mass) | Example 11 | 0.03 |  | 40 | 10 | 38 | 12 |
| Example 2 | Synthesis | MA |  | PGEE | PGMEA | PGME | DIW |
| (parts by mass) | Example 21 | 0.03 |  | 40 | 10 | 38 | 12 |
| Example 3 | Synthesis | MA |  | PGEE | PGMEA | PGME | DIW |
| (parts by mass) | Example 31 | 0.03 |  | 40 | 10 | 38 | 12 |
| Example 4 | Synthesis | MA |  | PGEE | PGMEA | PGME | DIW |
| (parts by mass) | Example 41 | 0.03 |  | 40 | 10 | 38 | 12 |
| Example 5 | Synthesis | MA |  | PGEE | PGMEA | PGME | DIW |
| (parts by mass) | Example 51 | 0.03 |  | 40 | 10 | 38 | 12 |
| Example 6 | Synthesis | MA |  | PGEE | PGMEA | PGME | DIW |
| (parts by mass) | Example 61 | 0.03 |  | 40 | 10 | 38 | 12 |
| Example 7 | Synthesis | MA |  | PGEE | PGMEA | PGME | DIW |
| (parts by mass) | Example 71 | 0.03 |  | 40 | 10 | 38 | 12 |
| Example 8 | Synthesis | MA |  | PGEE | PGMEA | PGME | DIW |
| (parts by mass) | Example 81 | 0.03 |  | 40 | 10 | 38 | 12 |
| Example 9 | Synthesis | MA |  | PGEE | PGMEA | PGME | DIW |
| (parts by mass) | Example 91 | 0.03 |  | 40 | 10 | 38 | 12 |
| Example 10 | Synthesis | MA |  | PGEE | PGMEA | PGME | DIW |
| (parts by mass) | Example 101 | 0.03 |  | 40 | 10 | 38 | 12 |
| Example 11 | Synthesis | MA |  | PGEE | PGMEA | PGME | DIW |
| (parts by mass) | Example 111 | 0.03 |  | 40 | 10 | 38 | 12 |
| Example 12 | Synthesis | MA |  | PGEE | PGMEA | PGME | DIW |
| (parts by mass) | Example 121 | 0.03 |  | 40 | 10 | 38 | 12 |

TABLE 2

|  | Si polymer solution | Additive 1 | Additive 2 | Solvent | | | |
|---|---|---|---|---|---|---|---|
| Example 13 | Synthesis | MA |  | PGEE | PGMEA | PGME | DIW |
| (parts by mass) | Example 131 | 0.03 |  | 40 | 10 | 38 | 12 |
| Example 14 | Synthesis | MA |  | PGEE | PGMEA | PGME | DIW |
| (parts by mass) | Example 141 | 0.03 |  | 40 | 10 | 38 | 12 |
| Example 15 | Synthesis | MA |  | PGEE | PGMEA | PGME | DIW |
| (parts by mass) | Example 151 | 0.03 |  | 40 | 10 | 38 | 12 |
| Example 16 | Synthesis | MA |  | PGEE | PGMEA | PGME | DIW |
| (parts by mass) | Example 161 | 0.03 |  | 40 | 10 | 38 | 12 |
| Example 17 | Synthesis | MA |  | PGEE | PGMEA | PGME | DIW |
| (parts by mass) | Example 171 | 0.03 |  | 40 | 10 | 38 | 12 |
| Example 18 | Synthesis | NfA |  | DIW |  |  |  |
| (parts by mass) | Example 181 | 0.01 |  | 100 |  |  |  |
| Example 19 | Synthesis | NfA |  | DIW |  |  |  |
| (parts by mass) | Example 191 | 0.01 |  | 100 |  |  |  |
| Example 20 | Synthesis | NfA |  | DIW |  |  |  |
| (parts by mass) | Example 201 | 0.01 |  | 100 |  |  |  |
| Example 21 | Synthesis | NfA |  | DIW |  |  |  |
| (parts by mass) | Example 211 | 0.01 |  | 100 |  |  |  |
| Example 22 | Synthesis | NfA |  | DIW |  |  |  |
| (parts by mass) | Example 221 | 0.01 |  | 100 |  |  |  |

TABLE 2-continued

| | Si polymer solution | Additive 1 | Additive 2 | Solvent | | | |
|---|---|---|---|---|---|---|---|
| | | | | PGEE | PGMEA | PGME | DIW |
| Comparative Example 1 (parts by mass) | Comparative Synthesis Example 11 | MA 0.03 | | 40 | 10 | 38 | 12 |
| Comparative Example 2 (parts by mass) | Comparative Synthesis Example 11 | MA 0.03 | TPSNO3 0.05 | PGEE 40 | PGMEA 10 | PGME 38 | DIW 12 |

(Preparation of Organic Resist Underlayer Film)

In a nitrogen atmosphere, a 100-ml four-necked flask was charged with 6.69 g (0.040 mol) of carbazole (available from Tokyo Chemical Industry Co., Ltd.), 7.28 g (0.040 mol) of 9-fluorenone (available from Tokyo Chemical Industry Co., Ltd.), 0.76 g (0.0040 mol) of p-toluenesulfonic acid monohydrate (available from Tokyo Chemical Industry Co., Ltd.), and 6.69 g of 1,4-dioxane (available from Kanto Chemical Co., Inc.), and the resultant mixture was stirred. The mixture was heated to 100° C. for dissolution, to thereby initiate polymerization. After the elapse of 24 hours, the mixture was left cool to 60° C. The mixture was then diluted with 34 g of chloroform (available from Kanto Chemical Co., Inc.) and reprecipitated in 168 g of methanol (available from Kanto Chemical Co., Inc.). The resultant precipitate was filtered and dried with a reduced pressure dryer at 80° C. for 24 hours, to thereby yield 9.37 g of a target polymer (Formula (F-1), hereinafter abbreviated as "PCzFL").

Formula (F-1)

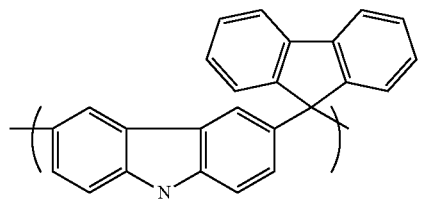

The results of $^1$H-NMR analysis of PCzFL were as follows:

$^1$H-NMR (400 MHz, DMSO-$d_6$): δ7.03-7.55 (br, 12H), δ7.61-8.10 (br, 4H), δ11.18 (br, 1H).

PCzFL was found to have a weight average molecular weight Mw of 2,800 as determined by GPC in terms of polystyrene and a polydispersity Mw/Mn of 1.77.

Subsequently, 20 g of the resultant resin was mixed with 3.0 g of tetramethoxymethyl glycoluril (trade name: Powderlink 1174, available from Mitsui Cytec Ltd.) serving as a crosslinking agent, 0.30 g of pyridinium p-toluenesulfonate serving as a catalyst, and 0.06 g of MEGAFAC R-30 (trade name, available from Dainippon Ink and Chemicals, Inc.) serving as a surfactant, and the mixture was dissolved in 88 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a solution of an organic resist underlayer film-forming composition used for a lithography process using a multilayer film.

(Tests for Solvent Resistance and Developer Solubility)

Each of the Si-containing resist underlayer film-forming compositions prepared in Examples 1 to 22 and Comparative Examples 1 and 2 was applied onto a silicon wafer with a spinner, and then heated on a hot plate at 215° C. for one minute, to thereby form an Si-containing resist underlayer film. Thereafter, a solvent of propylene glycol monomethyl ether/propylene glycol monomethyl ether acetate (=7/3) was applied onto the Si-containing resist underlayer film and then spin-dried for determining a change in film thickness between before and after application of the solvent. Solvent resistance was evaluated as "Good" when a change in film thickness was less than 1%, or evaluated as "Not cured" when a change in film thickness was 1% or more.

Similarly, each of the Si-containing coating liquids prepared in Examples 1 to 22 and Comparative Examples 1 and 2 was applied onto a silicon wafer with a spinner, and then heated on a hot plate at 215° C. for one minute, to thereby form an Si-containing resist underlayer film. Thereafter, an alkaline developer (2.38% aqueous TMAH solution) was applied onto the Si-containing resist underlayer film and then spin-dried for determining a change in film thickness between before and after application of the solvent. Developer resistance was evaluated as "Good" when a change in film thickness was less than 1%, or evaluated as "Not cured" when a change in film thickness was 1% or more.

TABLE 3

| | Solvent resistance | Developer resistance |
|---|---|---|
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Example 9 | Good | Good |
| Example 10 | Good | Good |
| Example 11 | Good | Good |
| Example 12 | Good | Good |

TABLE 4

| | Solvent resistance | Developer resistance |
|---|---|---|
| Example 13 | Good | Good |
| Example 14 | Good | Good |
| Example 15 | Good | Good |
| Example 16 | Good | Good |
| Example 17 | Good | Good |
| Example 18 | Good | Good |
| Example 19 | Good | Good |
| Example 20 | Good | Good |

TABLE 4-continued

|  | Solvent resistance | Developer resistance |
|---|---|---|
| Example 21 | Good | Good |
| Example 22 | Good | Good |
| Comparative Example 1 | Not cured | Not cured |
| Comparative Example 2 | Good | Good |

(Measurement of Dry Etching Rate)

Dry etching rate was measured with the following etchers and etching gases.

Lam 2300 (available from Lam Research Co., Ltd.): $CF_4/CHF_3/N_2$

RIE-10NR (available from SAMCO Inc.): $O_2$

Each of the resist underlayer film-forming compositions prepared in Examples 1 to 22 and Comparative Example 2 was applied onto a silicon wafer with a spinner, and then heated on a hot plate at 215° C. for one minute, to thereby form an Si-containing coating film (thickness: 0.02 μm (for measurement of etching rate with $CF_4$ gas), thickness: 0.02 μm (for measurement of etching rate with 02 gas)). Similarly, the organic resist underlayer film-forming composition was applied onto a silicon wafer with a spinner, to thereby form a coating film (thickness: 0.20 μm). The dry etching rate of the coating film was measured by using $CF_4/CHF_3/N_2$ gas and $O_2$ gas serving as etching gases, and was compared with the dry etching rate of the Si-containing coating film formed from each of the compositions of the Examples.

TABLE 5

|  | Fluorine-containing gas etching rate (nm/min) | Oxygen-containing gas Resistance (relative to organic resist underlayer film) |
|---|---|---|
| Example 1 | 46 | 0.03 |
| Example 2 | 50 | 0.02 |
| Example 3 | 46 | 0.02 |
| Example 4 | 43 | 0.02 |
| Example 5 | 38 | 0.03 |
| Example 6 | 43 | 0.03 |
| Example 7 | 43 | 0.02 |
| Example 8 | 46 | 0.02 |
| Example 9 | 49 | 0.02 |
| Example 10 | 49 | 0.03 |
| Example 11 | 43 | 0.02 |
| Example 12 | 46 | 0.02 |

TABLE 6

|  | Fluorine-containing gas etching rate (nm/min) | Oxygen-containing gas Resistance (relative to organic resist underlayer film) |
|---|---|---|
| Example 13 | 53 | 0.02 |
| Example 14 | 40 | 0.06 |
| Example 15 | 46 | 0.03 |
| Example 16 | 46 | 0.03 |
| Example 17 | 46 | 0.03 |
| Example 18 | 53 | 0.06 |
| Example 19 | 50 | 0.04 |
| Example 20 | 50 | 0.04 |

TABLE 6-continued

|  | Fluorine-containing gas etching rate (nm/min) | Oxygen-containing gas Resistance (relative to organic resist underlayer film) |
|---|---|---|
| Example 21 | 48 | 0.03 |
| Example 22 | 48 | 0.03 |
| Comparative Example 2 | 30 | 0.02 |

[Formation of Resist Pattern by EUV Exposure: Positive Alkali Development]

The aforementioned organic underlayer film (layer A)-forming composition was applied onto a silicon wafer, and then baked on a hot plate at 215° C. for 60 seconds, to thereby form an organic underlayer film (layer A) having a thickness of 90 nm. Each of the resist underlayer film-forming composition solutions prepared in Examples 1 to 22 of the present invention and Comparative Example 2 was applied onto layer A by spin coating, and then heated at 215° C. for one minute, to thereby form a resist underlayer film (layer B) (20 nm). An EUV resist solution (methacrylate resin resist) was applied onto the hard mask by spin coating, and then heated to form an EUV resist layer (layer C). The EUV resist layer was exposed to light with an EUV exposure apparatus (NXE3300B, available from ASML) under the following conditions: NA: 0.33, σ: 0.67/0.90, Dipole. After the light exposure, PEB was performed, and the resultant product was cooled on a cooling plate to room temperature, followed by development with an alkaline developer (2.38% aqueous TMAH solution) for 60 seconds and rinsing treatment, to thereby form a resist pattern. The resist pattern was evaluated for formation of a 20 nm line and space. The pattern shape was evaluated by observation of a cross section of the pattern.

In Table 7, "Good" indicates a shape between footing and undercut and a state of no significant residue in a space portion; "Collapse" indicates an unfavorable state of peeling and collapse of the resist pattern; and "Bridge" indicates an unfavorable state of contact between upper portions or lower portions of the resist pattern.

TABLE 7

|  | Pattern shape |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |

TABLE 8

|  | Pattern shape |
|---|---|
| Example 13 | Good |
| Example 14 | Good |
| Example 15 | Good |
| Example 16 | Good |
| Example 17 | Good |
| Example 18 | Good |

TABLE 8-continued

| | Pattern shape |
|---|---|
| Example 19 | Good |
| Example 20 | Good |
| Example 21 | Good |
| Example 22 | Good |
| Comparative Example 2 | Good |

[Formation of Resist Pattern by EUV Exposure: Negative Solvent Development]

The aforementioned organic underlayer film (layer A)-forming composition was applied onto a silicon wafer, and then baked on a hot plate at 215° C. for 60 seconds, to thereby form an organic underlayer film (layer A) having a thickness of 90 nm. Each of the resist underlayer film-forming composition solutions prepared in Examples 1 to 22 of the present invention and Comparative Example 2 was applied onto layer A by spin coating, and then heated at 215° C. for one minute, to thereby form a resist underlayer film (layer B) (20 nm). An EUV resist solution (methacrylate resin resist) was applied onto the hard mask by spin coating, and then heated to form an EUV resist layer (layer C). The EUV resist layer was exposed to light with an EUV exposure apparatus (NXE3300B, available from ASML) under the following conditions: NA: 0.33, σ: 0.67/0.90, Dipole. After the light exposure, PEB was performed, and the resultant product was cooled on a cooling plate to room temperature, followed by development with an organic solvent developer (butyl acetate) for 60 seconds and rinsing treatment, to thereby form a resist pattern. The resist pattern was evaluated for formation of a 22 nm line and space. The pattern shape was evaluated by observation of a cross section of the pattern.

In Table 9, "Good" indicates a shape between footing and undercut and a state of no significant residue in a space portion; "Collapse" indicates an unfavorable state of peeling and collapse of the resist pattern; and "Bridge" indicates an unfavorable state of contact between upper portions or lower portions of the resist pattern.

TABLE 9

| | Pattern shape |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |

TABLE 10

| | Pattern shape |
|---|---|
| Example 13 | Good |
| Example 14 | Good |
| Example 15 | Good |
| Example 16 | Good |
| Example 17 | Good |
| Example 18 | Good |
| Example 19 | Good |

TABLE 10-continued

| | Pattern shape |
|---|---|
| Example 20 | Good |
| Example 21 | Good |
| Example 22 | Good |
| Comparative Example 2 | Good |

(SPM, SC-1 Solubility Test)

Each of the Si-containing resist underlayer film-forming compositions prepared in Example 18 and Comparative Example 2 was applied onto a silicon wafer with a spinner, and then heated on a hot plate at 180° C. for one minute, to thereby form an Si-containing resist underlayer film. Thereafter, RS-30 (mixture of hydrogen peroxide and sulfuric acid) (available from Rasa Industries, LTD.) or hydrogen peroxide-aqueous ammonia was applied onto the Si-containing resist underlayer film and then spin-dried for determining a change in film thickness between before and after application of the solvent. Solubility was evaluated as "Good" when a change in film thickness was 90% or more, or evaluated as "Not dissolved" when a change in film thickness was less than 90%.

TABLE 11

| | SPM solution | SC-1 solution |
|---|---|---|
| Example 18 | Good | Good |
| Comparative Example 2 | Not dissolved | Not dissolved |

INDUSTRIAL APPLICABILITY

The present invention provides a resist underlayer film material that achieves a high etching rate during etching with halogen gas by a hydrolysis condensate (polysiloxane) containing a curing catalyst when a resist pattern is transferred onto an underlayer film in accordance with a reduction in the thickness of a resist film in a tri-layer process, and forms a resist underlayer film capable of being removed with a chemical after processing of a substrate.

The invention claimed is:

1. A method for producing a semiconductor device, the method comprising
a step (A) of applying, onto a semiconductor substrate, a resist underlayer film-forming composition containing (1) a hydrolysis condensate prepared through hydrolysis and condensation of a hydrolyzable silane in a non-alcoholic solvent in the presence of a strong acid, and (2) at least one of the hydrolyzable silane and a hydrolysis product of the hydrolyzable silane, followed by baking the composition, to thereby form a resist underlayer film;
a step (B) of applying a resist composition onto the resist underlayer film to thereby form a resist film;
a step (C) of exposing the resist film to light;
a step (D) of developing the resist film after the light exposure to thereby form a patterned resist film;
a step (E) of etching the resist underlayer film with the patterned resist film;
a step (F) of processing the semiconductor substrate with the patterned resist film and resist underlayer film; and
a step (G) of removing at least 90% in terms of thickness of the patterned resist underlayer film with a sulfuric acid-hydrogen peroxide mixture (SPM) prepared by mixing of aqueous hydrogen peroxide with sulfuric acid and/or an ammonia-hydrogen peroxide mixture (SC1) prepared by mixing of aqueous hydrogen peroxide with aqueous ammonia, wherein the patterned resist underlayer film is removed in a single step application of the sulfuric acid-hydrogen peroxide mixture and/or the ammonia-hydrogen peroxide mixture, and wherein:

the hydrolyzable silane contains a hydrolyzable silane of the following Formula (1):

$$R^1_a R^2_b Si(R^3)_{4-(a+b)}$$ Formula (1)

wherein $R^1$ is an organic group having a primary amino group, a secondary amino group, or a tertiary amino group and is bonded to a silicon atom via an Si—C bond; $R^2$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; le and $R^2$ are optionally bonded together to form a ring structure; $R^3$ is an alkoxy group, an acyloxy group, or a halogen group; a is an integer of 1; b is an integer of 0 to 2; and a+b is an integer of 1 to 3;

the hydrolyzable silane of Formula (1) is selected from the group consisting of:

 Formula (1-1)

 Formula (1-2)

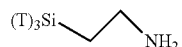 Formula (1-3)

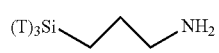 Formula (1-4)

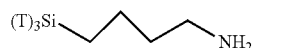 Formula (1-5)

 Formula (1-11)

 Formula (1-12)

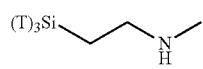 Formula (1-13)

 Formula (1-14)

 Formula (1-15)

 Formula (1-16)

 Formula (1-17)

 Formula (1-18)

 Formula (1-19)

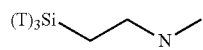 Formula (1-20)

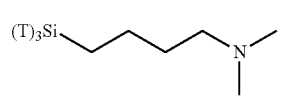 Formula (1-21)

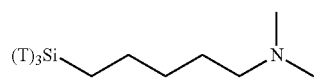 Formula (1-22)

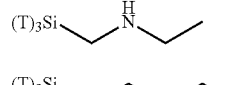 Formula (1-23)

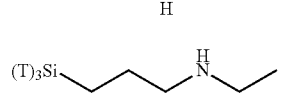 Formula (1-24)

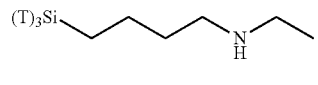 Formula (1-25)

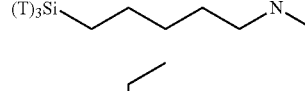 Formula (1-26)

 Formula (1-27)

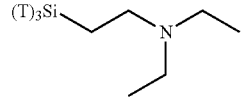 Formula (1-28)

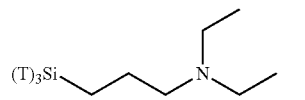 Formula (1-29)

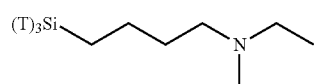 Formula (1-30)

 Formula (1-31)

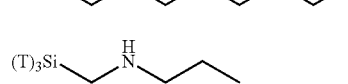 Formula (1-32)

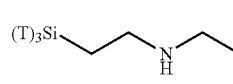 Formula (1-33)

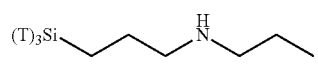 Formula (1-34)

 Formula (1-35)

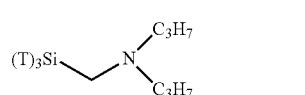 Formula (1-36)

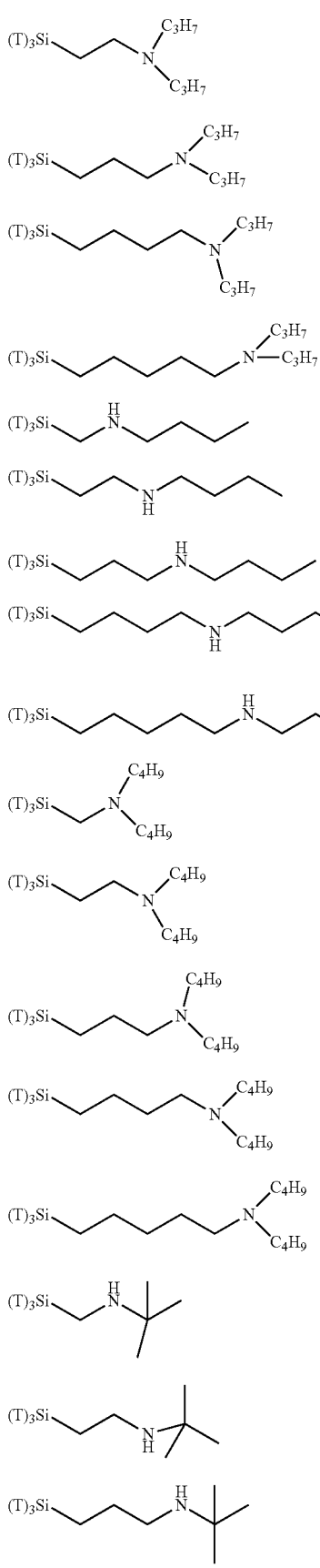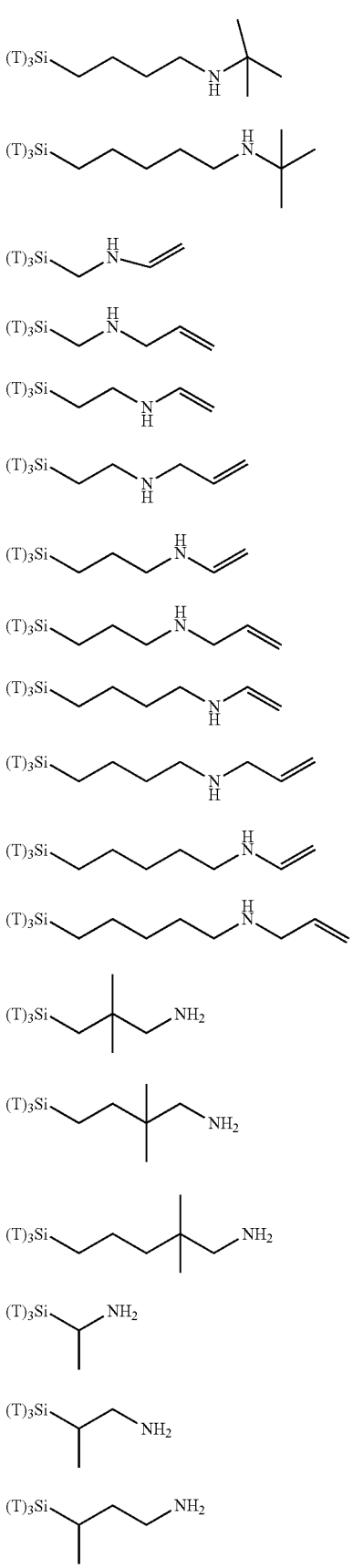

| Formula (1-72) | Formula (1-87) |
| Formula (1-73) | Formula (1-88) |
| Formula (1-74) | Formula (1-89) |
| Formula (1-75) | Formula (1-90) |
| Formula (1-76) | Formula (1-91) |
| Formula (1-77) | Formula (1-92) |
| | Formula (1-93) |
| | Formula (1-94) |
| Formula (1-78) | Formula (1-95) |
| Formula (1-79) | Formula (1-96) |
| Formula (1-80) | Formula (1-97) |
| Formula (1-81) | Formula (1-98) |
| Formula (1-82) | Formula (1-99) |
| Formula (1-83) | Formula (1-100) |
| Formula (1-84) | Formula (1-101) |
| Formula (1-85) | Formula (1-102) |
| | Formula (1-103) |
| Formula (1-86) | Formula (1-104) |

-continued

Formula (1-105)
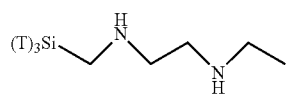

Formula (1-106)
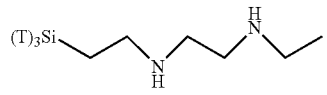

Formula (1-107)
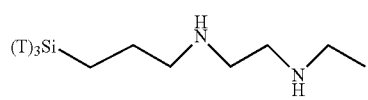

Formula (1-108)
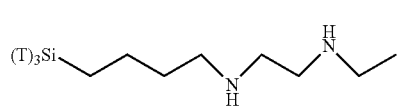

Formula (1-109)
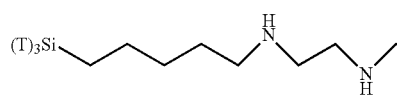

Formula (1-110)
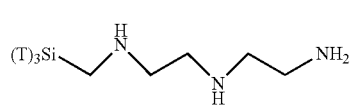

Formula (1-111)
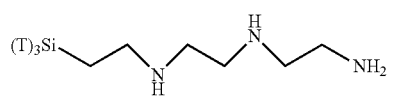

Formula (1-112)
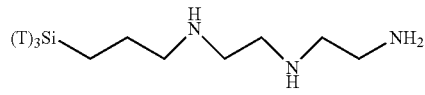

Formula (1-113)
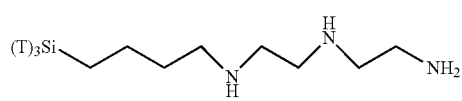

Formula (1-114)
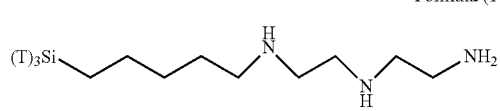

Formula (1-115)
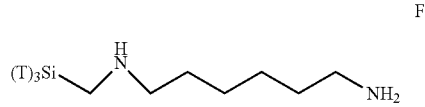

Formula (1-116)
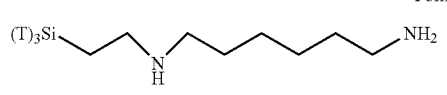

Formula (1-117)
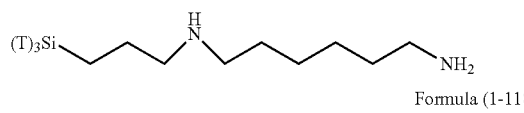

Formula (1-118)
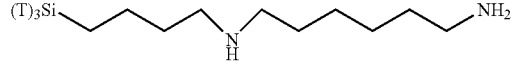

Formula (1-119)
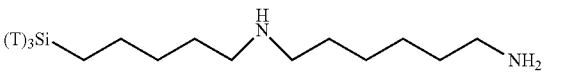

Formula (1-120)
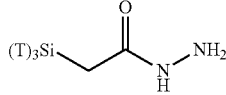

Formula (1-121)
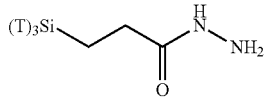

Formula (1-122)
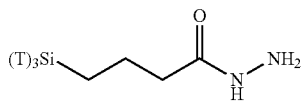

Formula (1-123)
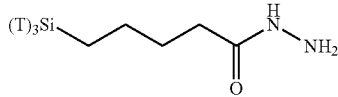

Formula (1-124)
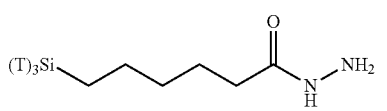 and

Formula (1-125)
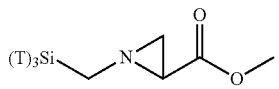

wherein T represents an alkoxy group, an acyloxy group, or a halogen group, and
the hydrolysis condensate contains an organic group having a salt structure formed between a counter anion derived from the strong acid and a counter cation derived from a primary ammonium group, a secondary ammonium group, or a tertiary ammonium group.

2. The method for producing a semiconductor device according to claim 1, wherein the non-alcoholic solvent is a ketone or an ether.

3. The method for producing a semiconductor device according to claim 1, wherein the strong acid is an inorganic acid or carboxylic acid having a pKa of 5 or less.

4. The method for producing a semiconductor device according to claim 1, wherein the hydrolyzable silane contains the hydrolyzable silane of Formula (1) and at least one additional hydrolyzable silane selected from the group consisting of
a hydrolyzable silane of the following Formula (2):

$$R^4_c Si(R^5)_{4-c}$$ 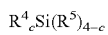 Formula (2)

wherein $R^4$ is an alkyl group, an aryl group, a halogenated alkyl group, a halogenated aryl group, an alkoxyaryl group, an alkenyl group, an acyloxyalkyl group, or an organic group having an acryloyl group, a methacryloyl group, a mercapto group, an amino group, an amide group, a hydroxyl group, an alkoxy group, an ester group, a sulfonyl group, or a cyano group, or any combination of these groups, and is bonded to a silicon atom via an Si—C bond; $R^5$ is an alkoxy group, an acyloxy group, or a halogen group; and c is an integer of 0 to 3, and a hydrolyzable silane of the following Formula (3):

Formula (3)

wherein $R^6$ is an alkyl group and is bonded to a silicon atom via an Si—C bond; $R^7$ is an alkoxy group, an acyloxy group, or a halogen group; Y is an alkylene group or an arylene group; d is an integer of 0 or 1; and e is an integer of 0 or 1.

5. The method for producing a semiconductor device according to claim 4, wherein an amount of the hydrolyzable silane of Formula (1) contained in the entire hydrolyzable silane is 0.1% by mole to 100% by mole relative to the total amount by mole of the entire hydrolyzable silane.

6. The method for producing a semiconductor device according to claim 1, wherein the resist underlayer film-forming composition further comprises a crosslinkable compound.

7. The method for producing a semiconductor device according to claim 1, wherein the resist underlayer film-forming composition further comprises an acid or an acid generator.

8. The method for producing a semiconductor device according to claim 1, wherein the resist underlayer film-forming composition further comprises water.

9. The method for producing a semiconductor device according to claim 1, wherein the resist underlayer film is an EUV resist underlayer film, and the resist underlayer film has a thickness of 1 nm to 30 nm.

\* \* \* \* \*